United States Patent
Jaiprakash et al.

(10) Patent No.: US 7,112,464 B2
(45) Date of Patent: Sep. 26, 2006

(54) DEVICES HAVING VERTICALLY-DISPOSED NANOFABRIC ARTICLES AND METHODS OF MAKING THE SAME

(75) Inventors: Venkatachalam C. Jaiprakash, Fremont, CA (US); Jonathan W. Ward, Fairfax, VA (US); Thomas Rueckes, Rockport, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 11/158,217

(22) Filed: Jun. 21, 2005

(65) Prior Publication Data

US 2006/0128049 A1 Jun. 15, 2006

Related U.S. Application Data

(60) Division of application No. 10/776,572, filed on Feb. 11, 2004, now Pat. No. 6,924,538, and a continuation-in-part of application No. 10/341,005, filed on Jan. 13, 2003, and a continuation-in-part of application No. 10/128,118, filed on Apr. 23, 2002, now Pat. No. 6,706,402, and a continuation-in-part of application No. 10/033,323, filed on Dec. 28, 2001, now Pat. No. 6,911,682, and a continuation-in-part of application No. 09/915,093, filed on Jul. 25, 2001, now Pat. No. 6,919,592.

(60) Provisional application No. 60/446,786, filed on Feb. 12, 2003, provisional application No. 60/446,783, filed on Feb. 12, 2003.

(51) Int. Cl.
*H01L 21/00* (2006.01)

(52) U.S. Cl. ........................................ 438/53

(58) Field of Classification Search .................... 438/53
See application file for complete search history.

(56) References Cited

U.S. PATENT DOCUMENTS

| | | | |
|---|---|---|---|
| 6,128,214 A | 10/2000 | Kuekes et al. | |
| 6,159,620 A | 12/2000 | Heath et al. | |
| 6,183,714 B1 | 2/2001 | Smalley et al. | |
| 6,198,655 B1 | 3/2001 | Heath et al. | |
| 6,221,330 B1 | 4/2001 | Moy et al. | |
| 6,232,706 B1 | 5/2001 | Dai et al. | |
| 6,340,822 B1 * | 1/2002 | Brown et al. | ........... 257/25 |
| 6,445,006 B1 | 9/2002 | Brandes et al. | |
| 6,518,156 B1 | 2/2003 | Chen | |
| 6,548,841 B1 | 4/2003 | Frazier et al. | |
| 6,559,468 B1 | 5/2003 | Kuekes et al. | |
| 6,574,130 B1 | 6/2003 | Segal et al. | |
| 6,643,165 B1 | 11/2003 | Segal et al. | |
| 6,673,424 B1 | 1/2004 | Lindsay | |
| 6,706,402 B1 | 3/2004 | Rueckes et al. | |
| 6,750,471 B1 | 6/2004 | Bethune et al. | |
| 6,759,693 B1 | 7/2004 | Vogeli et al. | |
| 6,774,052 B1 | 8/2004 | Vogeli et al. | |
| 6,781,166 B1 | 8/2004 | Lieber et al. | |
| 6,784,028 B1 | 8/2004 | Rueckes et al. | |
| 6,803,840 B1 | 10/2004 | Jin | |
| 6,809,465 B1 | 10/2004 | Hunt et al. | |
| 6,924,538 B1 | 8/2005 | Jaiprakash et al. | |
| 2002/0130311 A1 | 9/2002 | Lieber et al. | |
| 2002/0130353 A1 | 9/2002 | Lieber et al. | |
| 2002/0172963 A1 | 11/2002 | Kelley et al. | |
| 2002/0175390 A1 | 11/2002 | Goldstein et al. | |
| 2002/0179434 A1 | 12/2002 | Dai et al. | |
| 2003/0021966 A1 | 1/2003 | Segal et al. | |
| 2003/0124325 A1 | 7/2003 | Rueckes et al. | |
| 2004/0159833 A1 | 8/2003 | Rueckes et al. | |
| 2004/0164289 A1 | 8/2003 | Rueckes et al. | |
| 2003/0165074 A1 | 9/2003 | Segal et al. | |
| 2003/0234407 A1 | 12/2003 | Vogeli et al. | |
| 2003/0236000 A1 | 12/2003 | Vogeli et al. | |
| 2004/0085805 A1 | 5/2004 | Segal et al. | |
| 2004/0181630 A1 | 9/2004 | Jaiprakash et al. | |
| 2004/0191978 A1 | 9/2004 | Rueckes et al. | |
| 2004/0214366 A1 | 10/2004 | Segal et al. | |
| 2004/0214367 A1 | 10/2004 | Segal et al. | |

FOREIGN PATENT DOCUMENTS

WO    WO 01/03208 A1    1/2001

| WO | WO 01/44796 A1 | 6/2001 |
| WO | WO 04/065657 A1 | 8/2004 |

OTHER PUBLICATIONS

Ajayan, P.M., et al., "Nanometre-size tubes of carbon," *Rep. Prog. Phys.*, 1997, vol. 60, pp. 1025-1062.
Avouris, Ph., "Carbon nanotube electronics," Chem. Physics, 2002, vol. 281, pp. 429-445.
Casavant, M.J. et al., "Neat macroscopic membranes of aligned carbon nanotubes," *Journal of Appl. Phys.*, 2003, vol. 93(4), pp. 2153-2156.
Chen, R. J. et al., "Noncovalent Sidewall Functionalization of Single-Walled Carbon Nanotubes for Protein Immobilization," J. Am. Chem. Soc., 2001, vol. 123, pp. 3838-3839.
Choi, W.B. et al., "Carbon-nanotube-based nonvolatile memory with oxide-nitride-film and nanoscale channel," *Appl. Phys. Lett.*, 2003, vol. 82(2), pp. 275-277.
Cui, J.B. et al., "Carbon Nanotube Memory Devices of High Charge Storage Stability," *Appl. Phys. Lett.*, 2002, vol. 81(17), pp. 3260-3262.
Dai, H. et al., "Controlled Chemical Routes to Nanotube Architectures, Physics, and Devices," *J. Phys. Chem. B*, 1999, vol. 103, pp. 111246-11255.
Dequesnes, M. et al., "Calculation of pull-in voltages for carbon-nanotube-based nanoelectromechanical switches," *Nanotechnology*, 2002, vol. 13, pp. 120-131.
Dequesnes, M. et al., "Simulation of carbon nanotube-based nanoelectromechanical switches," *Computational Nanoscience and Nanotechnology*, 2002, pp. 383-386.
Fan, S. et al., "Carbon nanotube arrays on silicon substrates and their possible application," *Physica E*, 2000. vol. 8, pp. 179-183.
Farajian, A. A. et al., "Electronic transport through bent carbon nanotubes: Nanoelectromechanical sensors and switches," *Phys. Rev. B*, 2003, vol. 67, pp. 205423-1-205423-6.
Fischer, J.E. et al., "Magnetically aligned single wall carbon nanotube films: Preferred orientation and anisotropic transport properties," *Journal of Appl. Phys.*, 2003, vol. 93(4), pp. 2157-2163.
Franklin, N. R. et al., "Integration of suspended carbon nanotube arrays into electronic devices and electromechanical system," *Appl. Phys. Lett.*, 2002, vol. 81(5), pp. 913-915.
Fuhrer, M.S. et al., "High-Mobility Nanotube Transistor Memory," *Nano Letters*, 2002, vol. 2(7), pp. 755-759.
Homma, Y. et al., "Growth of Suspended Carbon Nanotubes Networks on 100-mm-scale Silicon Pillars," *Appl. Phys. Lett.*, 2002, vol. 81(12), pp. 2261-2263.
Kinaret, J.M. et al., "A carbon-nanotube-based nanorelay" *Appl. Phys. Lett.*, 2003, vol. 82(8), pp. 1287-1289.
Lee, K.H. et al., "Control of growth orientation for carbon nanotubes," *Appl. Phys. Lett.*, 2003, vol. 82(3), pp. 448-450.
Radosavljevic, M. et al., "Nonvolatile molecular memory elements based on ambipolar nanotube field effect transistors," *Nano Letters*, 2002, vol. 2(7), pp. 761-764.
Robinson, L.A.W., "Self-Aligned Electrodes for Suspended Carbon Nanotube Structures," *Microelectronic Engineering*, 2003, vols. 67-68, pp. 615-622.
Rueckes, T., et al., "Carbon Nanotube-Based Nonvolatile Random Access Memory for Molecular Computing" *Science*, 2000, vol. 289, pp. 94-97.
Soh, H. T. et al., "Integrated nanotube circuits: Controlled growth and ohmic contacting of single-walled carbon nanotubes," *Appl. Phys. Lett.*, 1999. vol. 75(5), pp. 627-629.
Sreekumar, T. V., et al., "Single-wall Carbon Nanotube Films", *Chem. Mater.* 2003, vol. 15, pp. 175-178.
Tour, J. M. et al., "NanoCell Electronic Mamories," *J. Am. Chem Soc.*, 2003, vol. 125, pp. 13279-13283.
Verissimo-Alves, M. et al., "Electromechanical effects in carbon nanotubes: Ab initio and anlytical tight-binding calculations," *Phys. Rev. B*, 2003, vol. 67, pp. 161401-1-161401-4.
Wolf, S., Silicon Processing for the VLSI Era; vol. 2—Process Integration, Multi-Level-Interconnect Technology for VLSI and ULSI, 1990, Section 4.3 Materials for Multilevel Interconnect Technologies, pp. 189-191, Lattice Press, Sunset Beach.
Wolf, S., Silicon Processing for the VLSI Era; vol. 2—Process Integration, 1990, Section 4.7 Manufacturing Yield and Reliability Issues of VLSI Interconnects, pp. 260-273, Lattice Press, Sunset Beach.
Zhan, W. et al., "Microelectrochemical Logic Circuits," *J. Am. Chem. Soc.*, 2003, vol. 125, pp. 9934-9935.
Zhang, Y. and Hongjie Dai. "Formation of metal nanowires on suspended single-walled carbon nanotubes." *Applied Physics Letters*, vol. 77 (Nov. 6, 2000): 3015-3017.

* cited by examiner

*Primary Examiner*—W. David Coleman
(74) *Attorney, Agent, or Firm*—Wilmer Cutler Pickering Hale and Dorr LLP

(57) ABSTRACT

Electro-mechanical switches and memory cells using vertically-disposed nanofabric articles and methods of making the same are described. An electro-mechanical device, includes a structure having a major horizontal surface and a channel formed therein. A conductive trace is in the channel; and a nanotube article vertically suspended in the channel, in spaced relation to a vertical wall of the channel. The article is electro-mechanically deflectable in a horizontal direction toward the conductive trace. Under certain embodiments, the vertically suspended extent of the nanotube article is defined by a thin film process. Under certain embodiments, the vertically suspended extent of the nanotube article is about 50 nanometers or less. Under certain embodiments, the nanotube article is clamped with a conducting material disposed in porous spaces between some nanotubes of the nanotube article. Under certain embodiments, the nanotube article is formed from a porous nanofabric. Under certain embodiments, the nanotube article is electromechanically deflectable into contact with the conductive trace and the contact is either a volatile state or non-volatile state depending on the device construction. Under certain embodiments, the vertically oriented device is arranged into various forms of three-trace devices. Under certain embodiments, the channel may be used for multiple independent devices, or for devices that share a common electrode.

8 Claims, 19 Drawing Sheets

DEVICES HAVING VERTICALLY-DISPOSED NANOFABRIC ARTICLES AND METHODS OF MAKING THE SAME

CROSS-REFERENCE TO RELATED APPLICATIONS

This application claims priority under 35 U.S.C. § 19(e) to U.S. Provisional Pat. Apl., Ser. No. 60/446,786, filed on Feb. 12, 2003, entitled Electro-Mechanical Switches and Memory Cells Using Vertically-Disposed Nanofabric Articles and Methods of Making the Same and to U.S. Pat. Apl. No. 60/446,783, filed on Feb. 12, 2003, entitled Electro-Mechanical Switches and Memory Cells Using Horizontally-Disposed Nanofabric Articles and Methods of Making the Same, which are incorporated herein by reference in their entirety.

This application is a divisional and claims priority under 35 U.S.C. § 121 to U.S. Pat. application Ser. No. 10/776,572, filed on Feb. 11, 2004, now U.S. Pat. No. 6,924,538 entitled Devices Having Vertically-Disposed Nanofabric Articles and Methods of Making the Same.

This application is a continuation-in-part and claims priority under 35 U.S.C. § 120 to the following applications which are expressly incorporated herein by reference in their entirety:

U.S. patent application Ser. No. 09/915,093, filed on Jul. 25, 2001, now U.S. Pat. No. 6,919,592 entitled Electromechanical Memory Array Using Nanotube Ribbons and Method for Making Same;

U.S. patent application Ser. No. 10/033,323, filed on Dec. 28, 2001, now U.S. Pat. No. 6,911,682 entitled Electromechanical Three-Trace Junction Devices.

U.S. patent application Ser. No. 10/128,118, filed Apr. 23, 2002, now U.S. Pat. No. 6,706,402 entitled Nanotube Films and Articles; and U.S. patent application Ser. No. 10/341,005, filed on Jan. 13, 2003, entitled Methods of Making Carbon Nanotube Films, Layers, Fabrics, Ribbons, Elements and Articles.

TECHNICAL FIELD

The present application relates to devices having vertically-disposed and other non-horizontally disposed nanofabric articles and to methods of making the same.

BACKGROUND

Memory devices have been proposed which use nanoscopic wires, such as single-walled carbon nanotubes, to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

U.S. Patent Publication No. 2003-0021966 discloses, among other things, electromechanical circuits, such as memory cells, in which circuits include a structure having electrically conductive traces and supports extending from a surface of a substrate. Nanotube ribbons are suspended by the supports that cross the electrically conductive traces. Each ribbon comprises one or more nanotubes. The ribbons are formed from selectively removing material from a layer or matted fabric of nanotubes.

For example, as disclosed in U.S. Patent Application Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Application Publication No. 2003-0124325, three-trace architectures may be used for electromechanical memory cells, in which the two of the traces are electrodes to control the deflection of the ribbon.

SUMMARY

The present invention provides new devices having vertically-disposed nanofabric articles and methods of making same.

Under certain aspects of the invention, an electro-mechanical device, includes a structure having a major horizontal surface and a channel formed therein. A conductive trace is in the channel; and a nanotube article vertically suspended in the channel, in spaced relation to a vertical wall of the channel. The article is electro-mechanically deflectable in a horizontal direction toward the conductive trace.

Under another aspect of the invention, the vertically suspended extent of the nanotube article is defined by a thin film process.

Under another aspect of the invention, the vertically suspended extent of the nanotube article is about 50 nanometers or less.

Under another aspect of the invention, the nanotube article is clamped with a conducting material disposed in porous spaces between some nanotubes of the nanotube article.

Under another aspect of the invention, the nanotube article is formed from a porous nanofabric.

Under another aspect of the invention, the nanotube article is electromechanically deflectable into contact with the conductive trace and the contact is either a volatile state or non-volatile state depending on the device construction.

Under other aspects of the invention, the vertically oriented device is arranged into various forms of three-trace devices.

Under yet other aspects of the invention, the channel may be used for multiple independent devices, or for devices that share a common electrode.

BRIEF DESCRIPTION OF THE DRAWINGS

In the Drawing,

FIGS. 3A–4C are cross-sectional diagrams of three-trace devices according to certain embodiments of the invention;

DETAILED DESCRIPTION

Preferred embodiments of the invention provide new articles having non-horizontally-disposed nanotube articles and provide methods of making same. Some embodiments provide improved ways of clamping or pinching suspended nanotube articles to improve their performance and manufacturability. Other embodiments provide electromechanical memory cells, which may be discrete or embedded. Under some embodiments, the discrete memory cells use new approaches to connect to other circuitry or cells, which lowers the resistivity of traces to the memory cells. Still other embodiments provide memory cells that have volatile information state (i.e., the information state is lost when power is interrupted). Some other embodiments use three-trace architectures analogous to those of U.S. Patent Application Publication No. 2003-0124325, in that a nanofabric article may be disposed between the electrodes to cause the article to deflect toward or away from one electrode or the other. These embodiments may utilize a combination of volatile and non-volatile characteristics; for example, information state may be non-volatile, but the device may use a three-trace architecture in which the deflection of the nanotube article may be caused by a trace having volatile state characteristics.

Nanofabrics or ribbons, created by growth or application of individual tubes have been shown to substantially conform to substrate surfaces, such as a surface of a semiconductor substrate. Preferred embodiments of the present make devices such as electromechanical switches and memory cells using nanofabrics that conform to a surface which is substantially perpendicular to a semiconductor substrate (i.e. the nanofabrics are vertically-oriented, relative to a horizontal substrate). Devices and fabrication techniques to develop such vertically-disposed devices are described below, and include the ability to form switches and memory cells having relatively short spans of vertically suspended nanofabric articles with corresponding reductions in gap heights. In some embodiments, this allows for the use of smaller device dimensions and lower electrical resistances (and corresponding decreased cycling times and increased speed, e.g., performance up 100 GHz or more). Volatile and non-volatile switches, and numerous types of devices, examples of which are provided for illustration, can be thus created. In certain preferred embodiments, the articles are substantially a monolayer of carbon nanotubes.

Figure 1A:
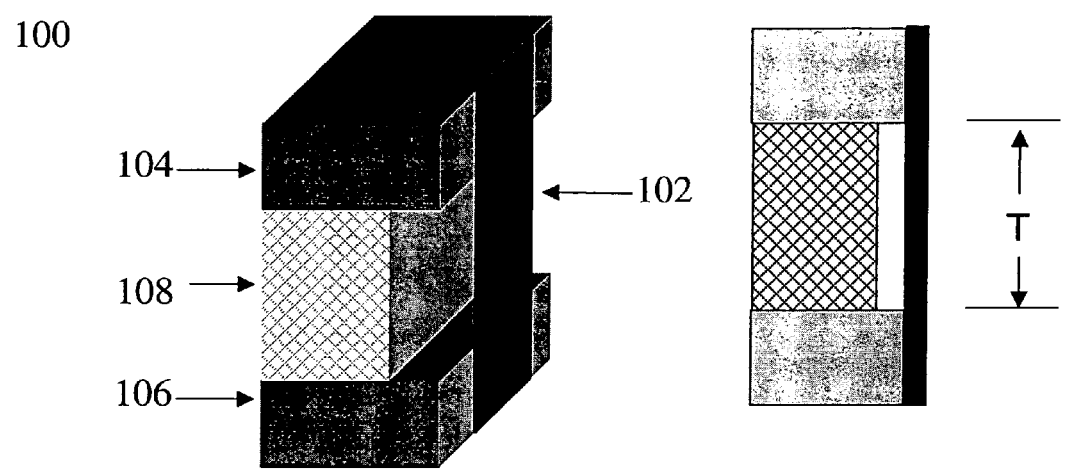
FIGS. 1A–B are perspective and cross-sectional views of an exemplary electromechanical switch.
Figure 1B:
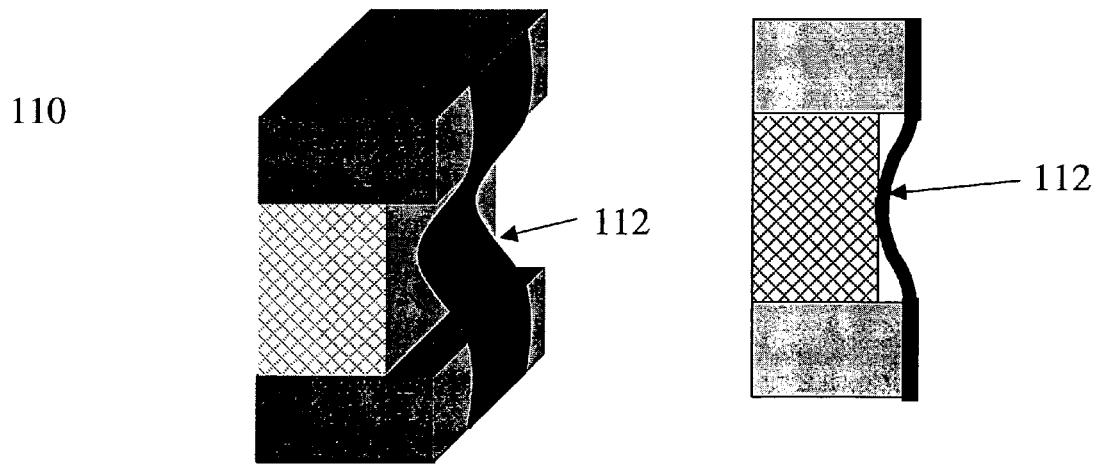

FIGS. 1A–B are perspective and cross-sectional views of an exemplary electromechanical switch. Structure 100 (FIG. 1(A)) depicts an "off" state and structure 110 (FIG. 1(B)) depicts an "on" state. The designations "on" and "off" are in some sense arbitrary, and this notation may be reversed with no loss of generality. In this embodiment, the structure contains nanofabric article 102 spanning between an upper insulating support structure 104 and a lower insulating support structure 106. Disposed between upper and lower insulating support structures 104 and 106 is an electrode 108.

Note that reference to a nanofabric, such as nanofabric article 102, is generally meant to include any suitable structure or article comprising nanotubes, and specifically includes ribbons and nanofabric electrodes containing nanotubes.

Figure 5:
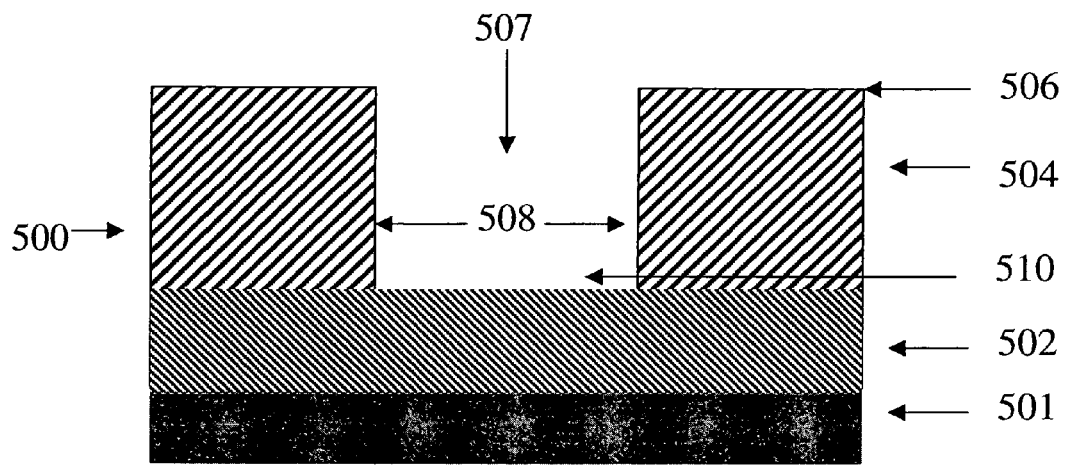
FIGS. 5A–L illustrate an exemplary method of fabricating devices according to certain embodiments of the invention.
Figure 5:
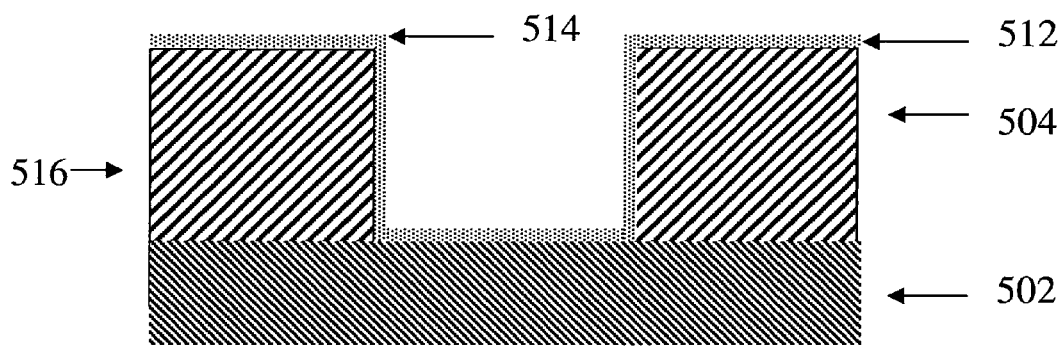

Under certain preferred embodiments, a nanofabric article 102 has a span T of less than about 180 nm or smaller and is pinned to insulating support structures 104 and 106 (seen more clearly in FIG. 5L). The span of nanofabric will depend on deposition technique used, and under certain embodiments suspended spans can be shorter than lithographically-produced spans. The inventors envision vertical spans as small or smaller than 30 nm. Pinning of nanofabric articles is described here and elsewhere in the incorporated references in more detail. The electrode 108 may be made of any suitable electrically conductive material and may be arranged in any of a variety of suitable geometries. Certain preferred embodiments utilize n-doped silicon to form such a conductive element which can be, preferably no wider than the nanofabric article 102, e.g., about 180 nm or below. Other embodiments utilize metal as conductor. In certain embodiments the electrode 108 can be constructed from a nanofabric as well.

The material of the insulating support structures 104 and 106, likewise, may be made of a variety of materials and into various geometries, but certain preferred embodiments utilize insulating material, such as spin-on-glass (SOG) or silicon nitride or silicon oxide.

As will be explained below, in certain embodiments, the nanofabric article 102, as shown is held to the insulating support structures by friction. In other embodiments, the nanofabric article 102 may be held by other means, such as by anchoring, stitching or pinning the nanofabric to the insulating support structures using any of a variety of techniques.

Specifically, the nanofabric article 102 may be coupled to another material by introducing a matrix material into the spaces between nanotubes in a porous nanofabric to form a conducting composite junction, as described in the references incorporated above. Electrical and mechanical advantages may be obtained by using such composite junctions and connections. In one example, a conducting material is deposited onto the nanofabric and is allowed to penetrate into the spaces within the porous nanofabric, thus forming an improved electrical connection to the nanofabric and reduces contact resistance in the article. In another example, an insulating material is deposited onto the nanofabric and is allowed to penetrate into the spaces within the porous nanofabric, thus forming an improved mechanical pinning contact that increases reliability and manufacturability.

Evaporated or spin-coated material such as metals, semiconductors or insulators especially—silicon, titanium, silicon oxide or polyamide—may be used to increase the pinning strength. The friction interaction can be increased through the use of chemical interactions, including covalent bonding through the use of carbon compounds such as pyrenes or other chemically reactive species. See R. J. Chen et al., "Noncovalent Sidewall Functionalization of Single-Walled Carbon Nanotubes for Protein Immobilization," J. Am. Chem. Soc., vol. 123, pp. 3838–39 (2001), and Dai et al., Appl. Phys. Lett., vol. 77, pp. 3015–17 (2000), for exemplary techniques for pinning and coating nanotubes by metals. See also WO 01/03208 for techniques.

In some embodiments in which a nanofabric article 102 is spaced apart from and crosses a corresponding, oppositely-disposed electrode, the intersection defines a memory or logic cell, switch or relay. More than one memory cell can be used in arrays or as individual or small groups of interconnected switches depending upon the application such as embedded memory, a two-chip memory device, relays or actuators. The actual number of such cells is immaterial to understanding the invention, but the technology may support devices having information storage capacities at least on the order of modern nonvolatile circuit devices.

FIGS. 2A–4C are cross-sectional diagrams of individual nanoswitches illustrating various states of the device.

Figure 2A:
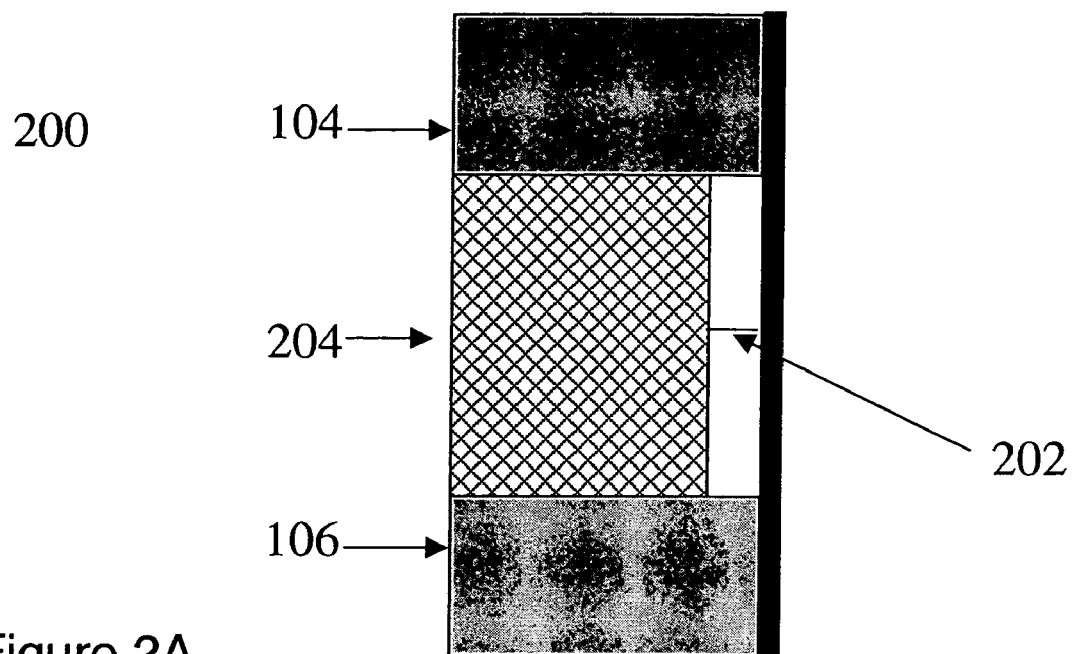
FIGS. 2A–B are cross-sectional views of devices according to certain embodiments of the invention.
Figure 2B:
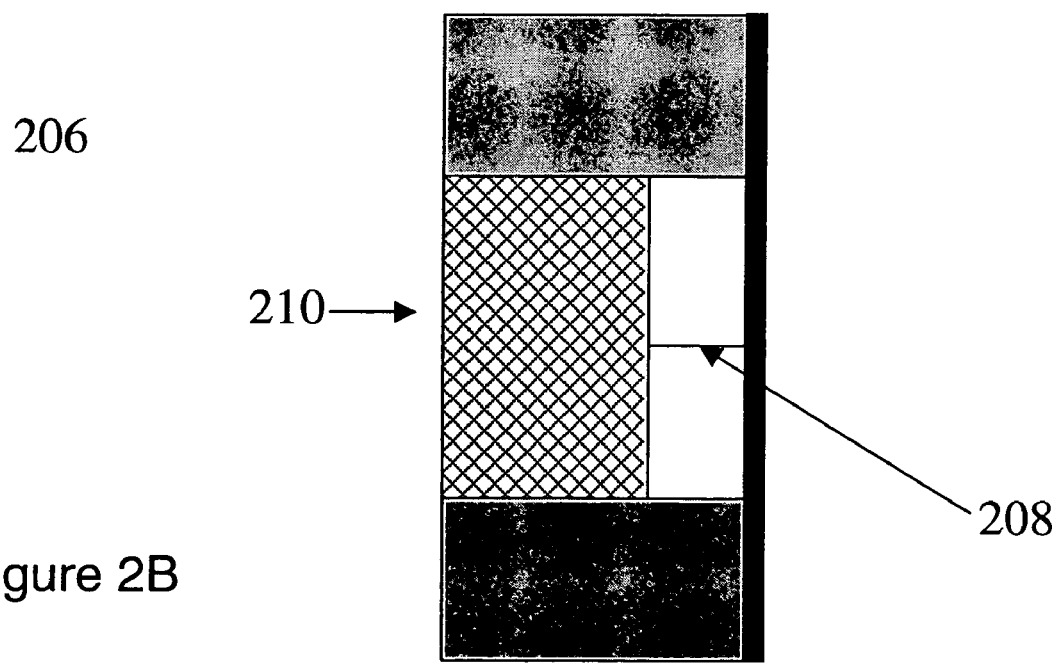

FIGS. 2A–B illustrate nanoswitches with different gap distances 202 and 208 between nanofabric article 102 and electrodes 204 and 210, respectively. In preferred embodiments, the vertical spacing between the insulating support structures 104 and 106 is less than 180 nm; this height is dependent upon the deposition technique used. In the case of a switch with a 180 nm span of suspended fabric, the relative separation, i.e. gap distance 202, from the top of insulating support structure 104 to the deflected position where the nanofabric article 102 attaches to electrode 204 should be approximately 5–50 nm. In switches with smaller spans, the gap would likely also be smaller. The magnitude of the gap distance 202 is designed to be compatible with electromechanical switching capabilities of the memory device or other electronic application. The 5–50 nm gap distance is preferred for certain embodiments utilizing nanofabrics 102 made from carbon nanotubes, and reflects the specific interplay between strain energy and adhesion energy for the deflected nanotubes. Other gap distances may be preferable for other materials. Switching between these states is accomplished by the application of specific voltages across the nanofabric article 102 and one or more of its associated electrodes, e.g. 204, 210. Switching forces are based on the interplay of electrostatic attraction and repulsion between the nanofabric article 102 and the electrodes, e.g. 204, 210.

By selecting a gap distance 202 in which the strain energy is lower than the adhesion energy the nanofabric article 102 can remain in permanent "non-volatile" contact with the electrode 204. If a larger gap distance 208 were selected, the strain energy increases to such an extent as to allow the nanofabric article 102 to contact the electrode 210 but not to remain in such contact without additional power input, defining a "volatile" condition. In some embodiments, such a volatile switch is preferred and can be combined with non-volatile switches as is necessary to generate particular electronic devices.

The dimensions given above are exemplary and non-limiting, and can be greater or smaller in some embodiments, depending on the application and materials and techniques used. The length of the nanofabric article 102 in these and other vertically-disposed articles can be quite short in comparison to other types of nanofabric articles. In some cases, thin film techniques, such as thin film deposition or etching can be used rather than using lithographic techniques to form the electrodes and gaps spanned by the suspended nanofabric ribbons. In some embodiments the suspended length can be shorter than the length of the nanofabrics used in horizontally disposed devices, such as those in the incorporated reference entitled "Electro-Mechanical Switches and Memory Cells Using Horizontally-Disposed Nanofabric Articles and Methods of Making the Same" (U.S. Provisional Pat. Apl. Ser. No. 60/446,783), filed on Feb. 12, 2003; filed on even date herewith U.S. Apl. Ser. No. yet to be assigned). The dependence on thin film deposition rather than lithographic patterning of the devices makes for more facile manufacturing.

A short span of nanofabric can lead to enhanced reliability and vastly increased switching speeds up to 200 GHz for concomitantly lowered gap heights. Also, shorter spans of nanofabric result in reduced electrical resistance to current flowing through the nanofabric. Further embodiments, below, illustrate other types of vertically-disposed articles, and methods of manufacturing the same.

FIGS. 3A–C illustrate two possible "on" states of certain embodiments of the invention. When the device is as illustrated by 302 (FIG. 3A, structure 300), the nanofabric article 102 is separated from both electrodes 304 and 306 by a distance 202. This state may be electrically detected in any of a variety of ways described in the foregoing references incorporated by reference. In this arrangement, an "off" state corresponds to nanofabric-electrode junction being an open circuit, which may be sensed as such on either the nanofabric article 102 or electrode 304 when addressed. When the cell is as shown by 308 (FIG. 3B, structure 310), the nanofabric article 102 is deflected toward electrode 304. In certain embodiments the "on" states corresponding to the nanofabric-electrode junction is an electrically conducting, rectifying junction (e.g., Schottky or PN), which may be sensed as such on either the nanofabric article 102 or electrode 306 when addressed. When the cell is as shown by 312 (FIG. 3C, structure 314), the nanofabric article 102 is deflected toward electrode 306 generating an "on" state. The figures are not drawn to scale, and the distances 202, for example, need not be equal. Alternatively, one or the other of the electrodes may act as "set" electrode used alone or in combination with the other electrode to cause the nanotube article to deflect into contact with an electrode, and the other of the electrodes may act as a "release" electrode used alone or in combination with the other electrode to cause the nanotube article to release from contact with the electrode.

FIGS. 4A–C illustrate some other possible tristate or tri-trace device configurations. A first tri-trace device 400 (FIG. 4A) has two non-volatile "on" states. The distance 202 between the non-deflected nanofabric article 102 and either electrode 402 or 404 is small enough that upon deflection the nanofabric contacts either electrode 402 or 404. Under this embodiment a stable van der Waals interaction is formed yielding a non-volatile condition in which the deflected nanofabric article 102 contacts either electrode, closing a circuit and remaining in contact with the electrode indefinitely without the need for additional power.

A second tri-trace device 406 (FIG. 4B) allows for nanofabric deflection to be either non-volatile or volatile. If the nanofabric article 102 deflects toward electrode 410, then the distance 202 is small enough to allow for a nonvolatile state as above. If, however the nanofabric article 102 is deflected toward electrode 408, then the gap distance 208, between the nanofabric article 102 and the contacted electrode 408 has been increased such that the strain energy of the stretched nanofabric article 102 overcomes the van der Waals attraction between the nanofabric article 102 and the electrode 408; the nanofabric article 102 briefly forms part of a closed circuit generating a transient "on" state and returns to its non-deflected, open circuit state generating an "off" state.

Compare structure 400, which may be used as non-volatile switch, to structure 406, which includes a volatile switch with gap 208. In structure 406 the gap height 208 between the nanofabric and the electrode 408 has been increased such that the strain energy of the stretched nanofabric overcomes the van der Waals attraction between the fabric and the electrode. The nanofabric forms part of a closed circuit and returns to its non-deflected, open circuit state. It should be noted that the effect of the van der Waals interaction between nanofabrics and other elements can be affected at their interface(s). The effect may be enhanced or diminished; e.g., the attractive force can be diminished by coating the surface of the electrode with a thin layer of oxide or other suitable materials. A purpose of this diminishing of attractive forces may be to create volatile nanoswitches; such volatile switches may be especially useful in applications such as relays, sensors, transistors, etc.

Structure 412 (FIG. 4C) illustrates yet a third tri-trace device where the gap distances 208 between the nanofabric article 102 and the electrodes 414 and 416 are large enough to form volatile nanoswitches as described above.

In certain embodiments involving a non-volatile cell, there is a high ratio between resistances in the "off" and the "on" states. The differences between resistances in the "off" and "on" states provides a means to read which state a junction is in. In one approach, a "readout" current is applied to the nanofabric or electrode and the voltage across the junction is determined with a "sense amplifier" on the electrodes. Reads are non-destructive, meaning that the cell retains its state, and no write-back operations are needed as is required with semiconductor DRAMs. As alluded to above, the three-trace junctions of preferred embodiments bring their own advantages. By allowing for use of tristate memory cells, more information may be stored or represented by a given cell. Moreover, even if only one of the "on" states were used, three-trace junctions may increase switching speeds from the ability to use both conductive traces in concert to apply forces to move an electromechanically responsive nanofabric 102.

Figure 3:
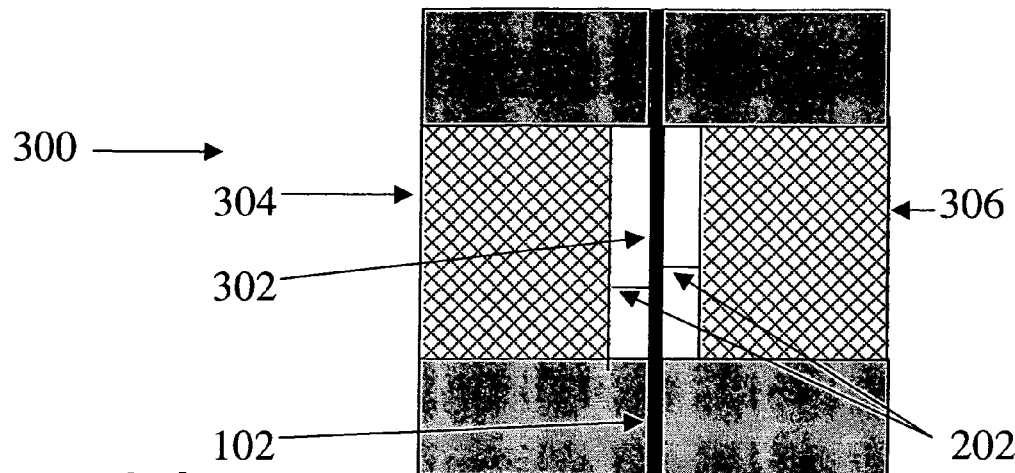
Figure 3:
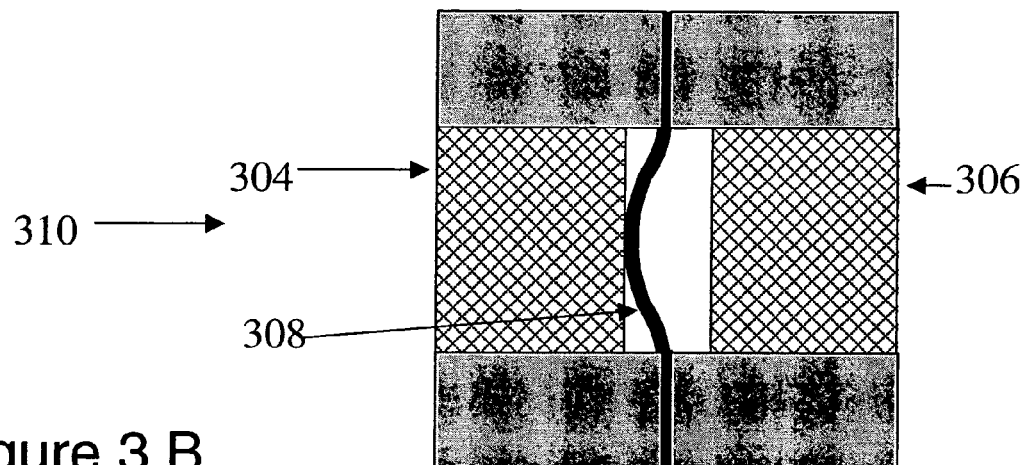
Figure 3:
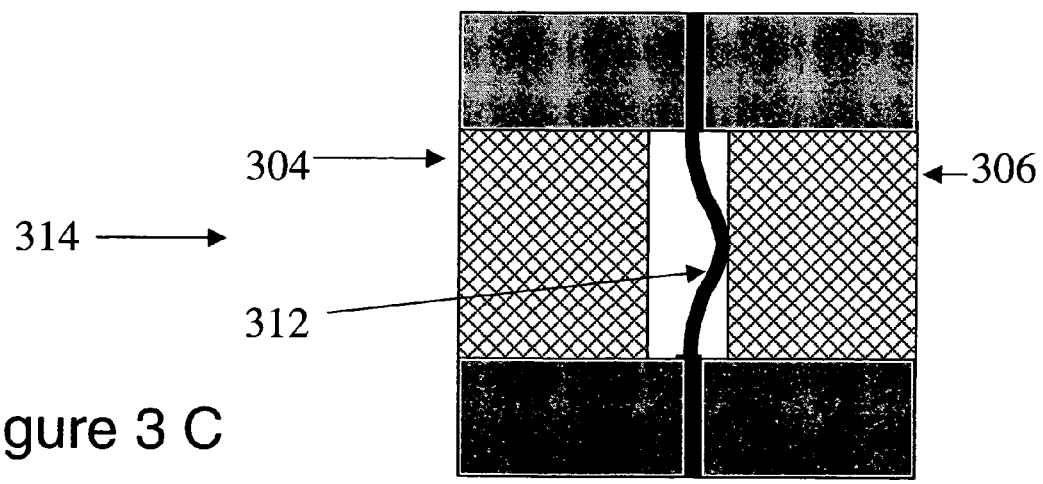
Figure 4:
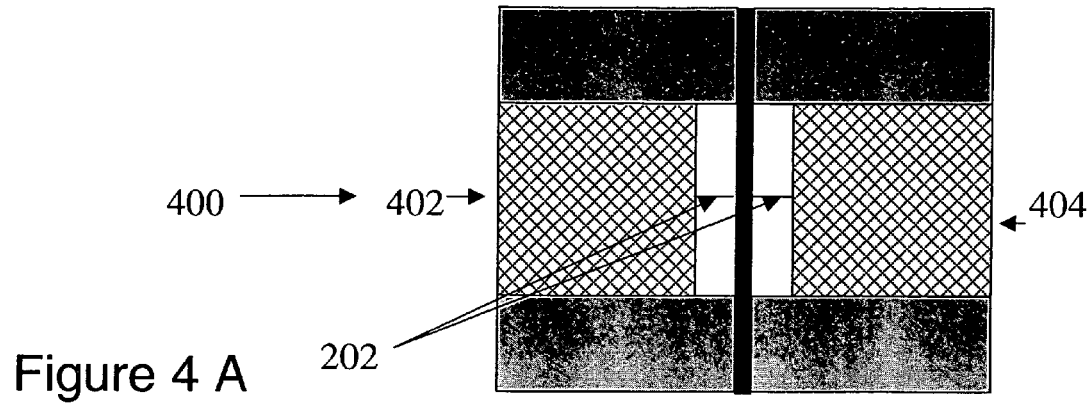
Figure 4:
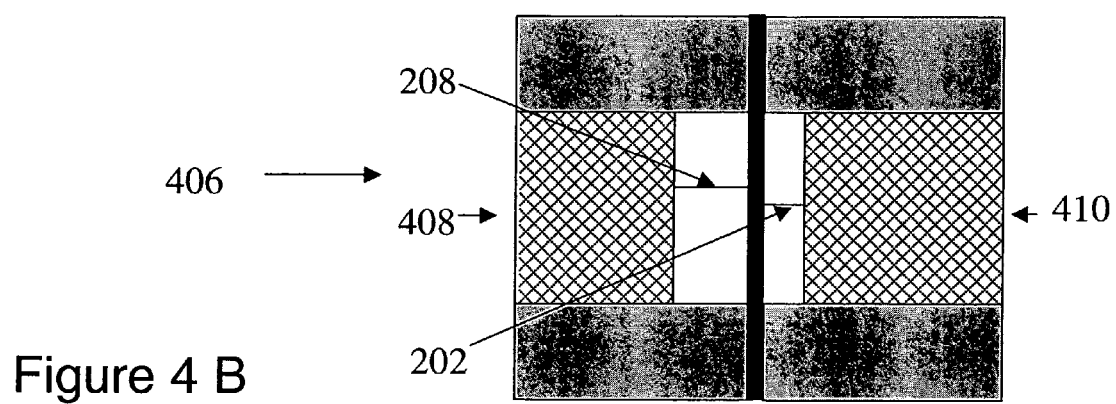
Figure 4:
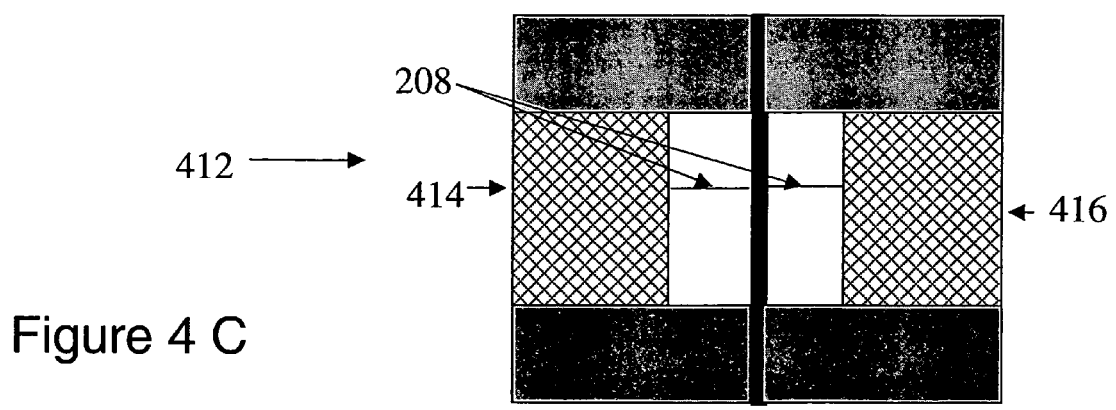

Among other things the structures as shown in FIGS. 3 and 4 (generally) facilitate packaging and distribution, and allow the nanotube-technology cells to be more easily incorporated into other circuits and systems such as hybrid circuits. The vertical nature of the electrical architecture can also facilitate the production of stackable memory layers and the simplification of various interconnects. Preferably, the nanotube patch or segment is clamped (above and below) up to the portion of the nanofabric article that is so suspended. In addition, preferably, the nanofabric article is connected or joined to high conductivity signal paths.

One aspect of the present invention is directed to formation of conductive composite junctions whereby a suitable matrix material is disposed within and around the nanotubes or fibers of a nanofabric or other porous nano material. Such junctions can provide desirable mechanical and/or electrical properties. For example, electrical contact between a nanofabric and a metal connection or activation point may be enhanced, or the contact resistance may be decreased by applying the metal contact as a matrix material impregnating the nanofabric tubes. Also, mechanical contact and strain may be increased as a result of the increased contact between the nanotubes and the matrix material.

Cross-sectional FIGS. 5A–L, collectively, illustrate an exemplary method of fabricating a substantially vertical nano-electromechanical switch. By vertical it is meant that the switching element is substantially perpendicular to the major surface of the substrate. This aspect will be illustrated and described in detail below. Certain advantages can be realized in manufacturing such device using conformal nanotube and/or nanofabric materials. As a result, the length of the nanofabric article can be reduced in some embodiments by about two orders of magnitude. Additionally, the electrical resistance of a current-carrying nanofabric article is substantially reduced when the length of the article is reduced, as described herein.

In FIG. 5A, a semiconductor substrate 501 coated with an insulating layer 502 such as silicon dioxide or silicon nitride is provided. The insulating layer 502 is preferably a few nanometers in thickness but could be as much 1 μm thick depending upon the electrical characteristics desired for different applications. A second layer 504 is deposited on insulating layer 502. Two non-exclusive examples of the material the second layer 504 can be made from are metals and semiconductors; the second layer having a top surface 506. A cavity 507 is defined in the second layer 504. The cavity 507 can be created by reactive ion etching into the second layer 504; the cavity 507 is defined by inner walls 508 and an exposed top surface 510 of insulating layer 502. In certain embodiments, a portion of second layer 504 remains such that the bottom of the cavity 507 is conductive. Alternatively, an insulating layer 502 could be provided to top surface 506 which could be etched to generate a cavity. The cavity 507 can be prefabricated as part of a trench or a via provided as part of preprocessing steps, e.g., as part of an overall integration scheme in generation of an electronic device.

FIG. 5B illustrates a first insulating layer 512 made of silicon nitride or other material deposited on top of the exposed top surface 510 and top surface 506 to generate top layer 514 of intermediate structure 516. According to one embodiment, the first insulating layer 512 is selectively etchable over polysilicon, nanotubes and silicon oxide or other selected insulator. A first insulating layer 512 which will act as a sacrificial layer to create a gap between subsequent layers can be in a range of thicknesses described below as shown in intermediate structure 516.

Figure 5C:
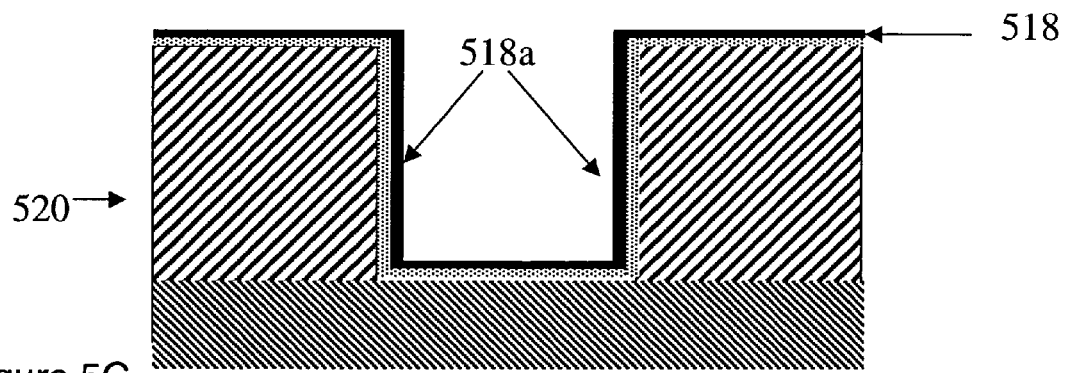
Figure 5:
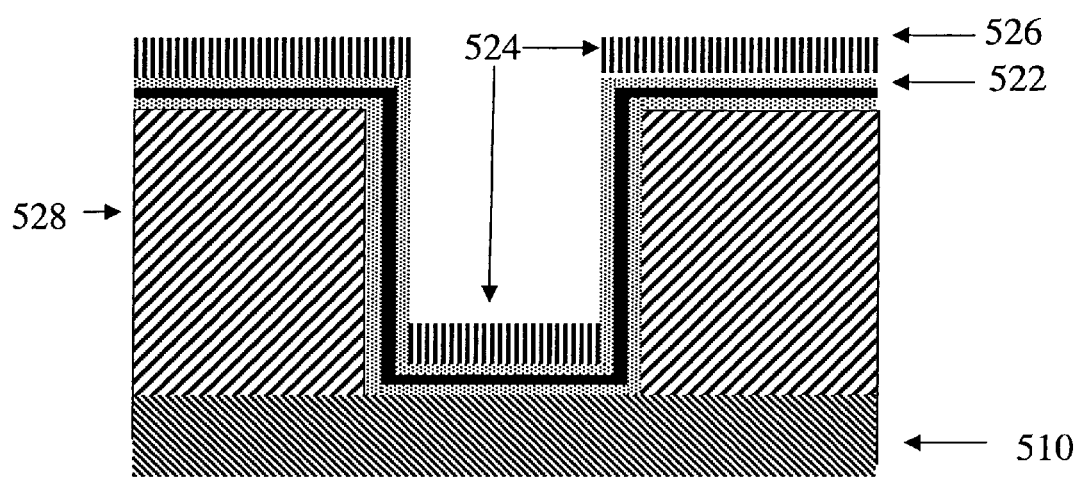
Figure 5:
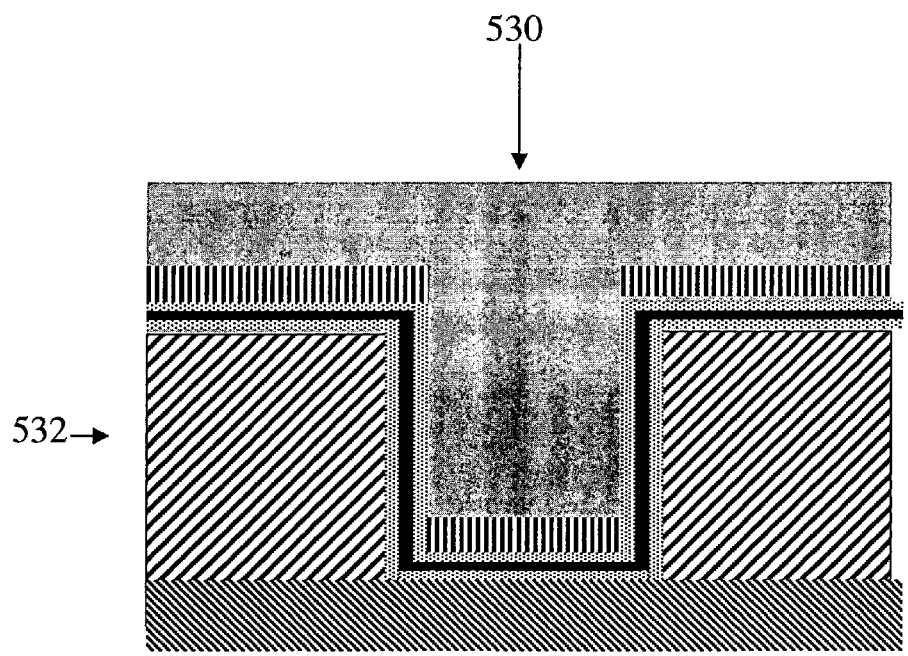
Figure 5:
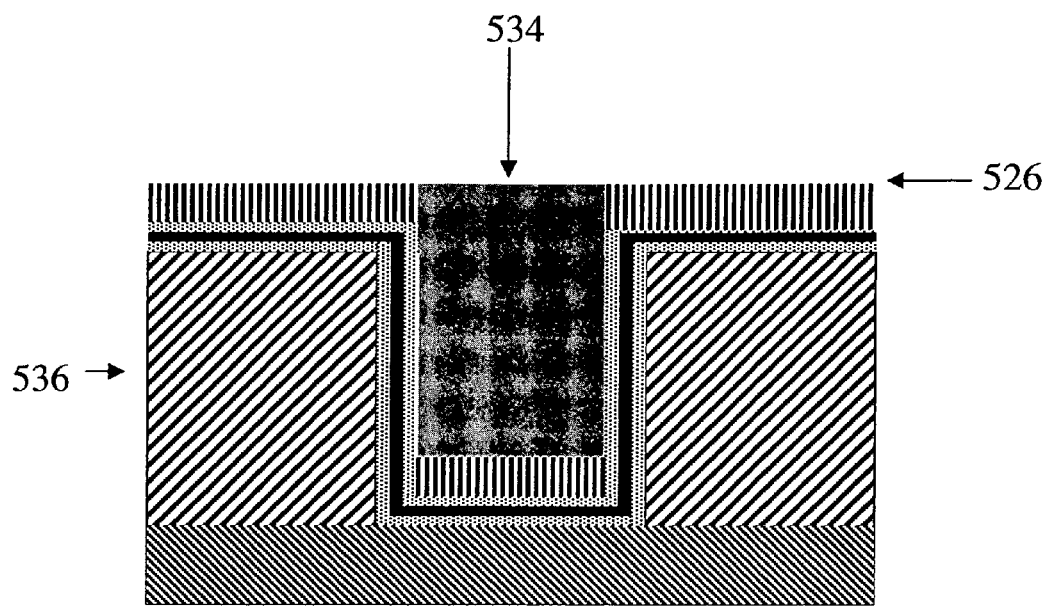
Figure 5:
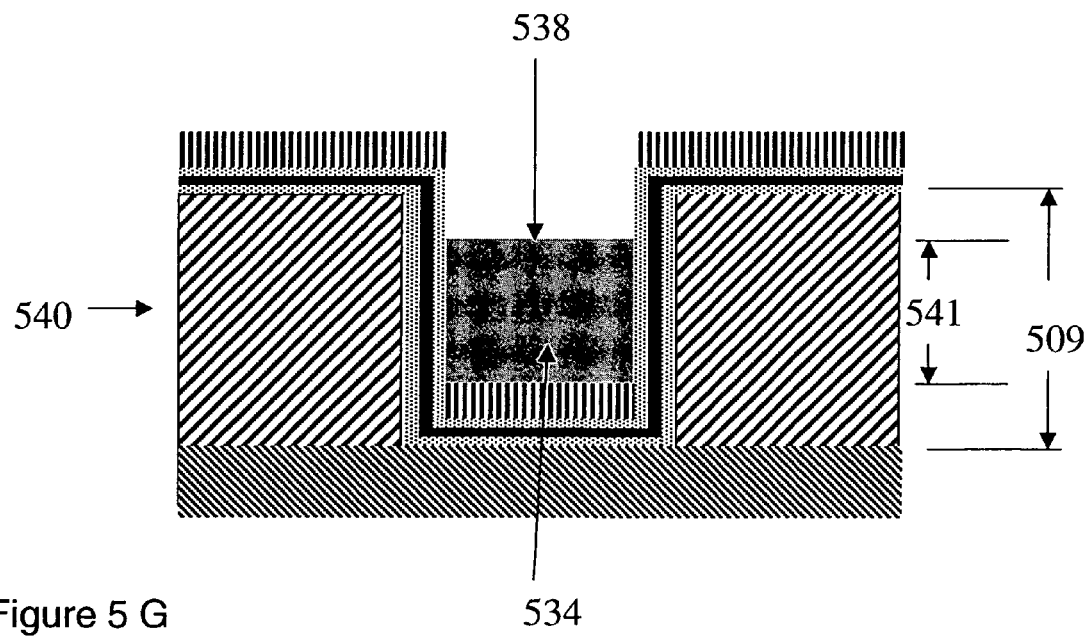
Figure 5:
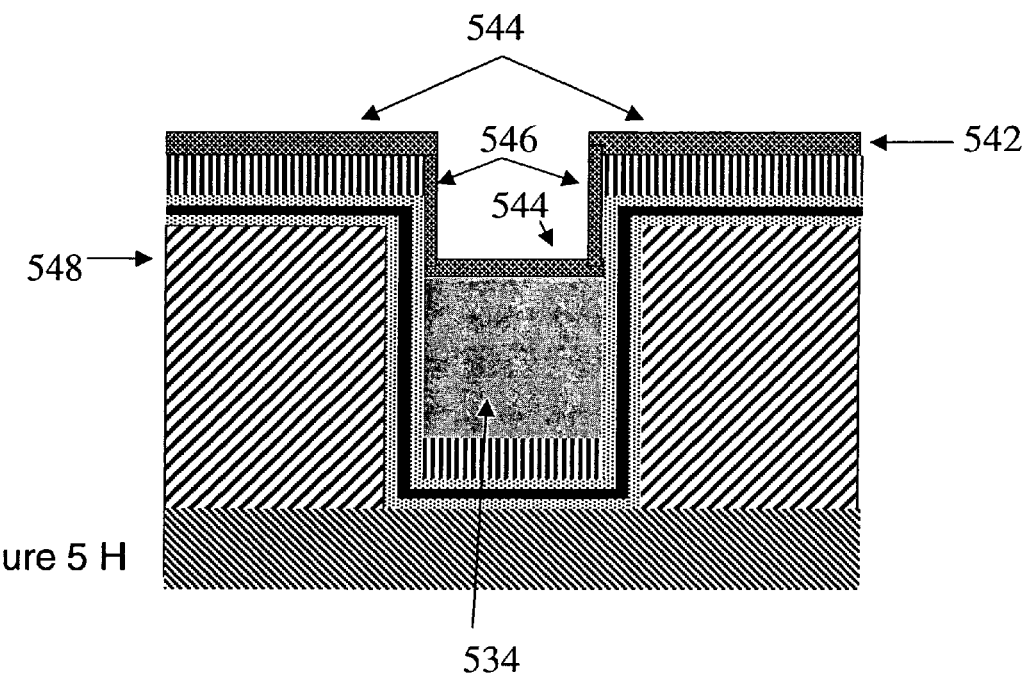
Figure 5:
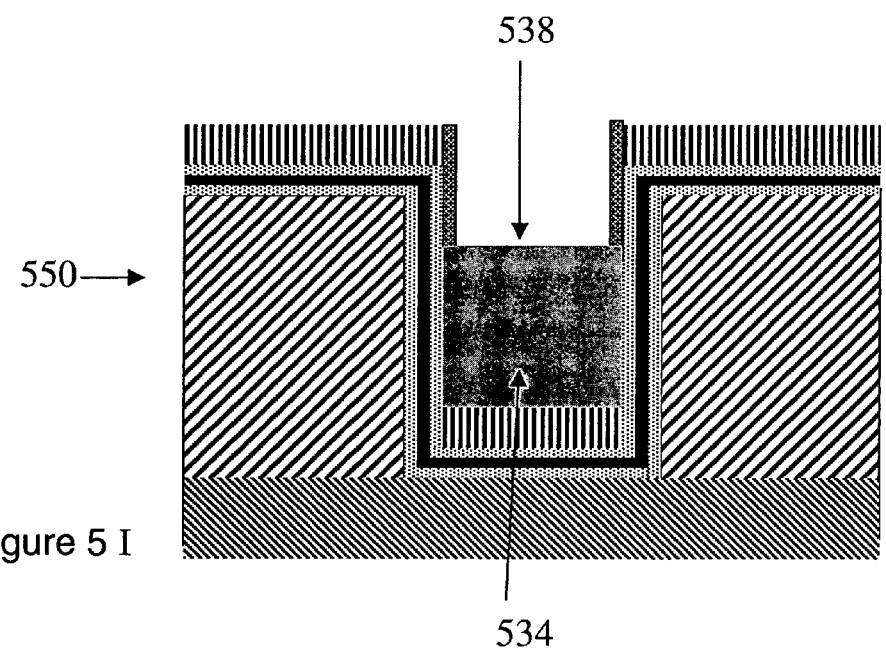
Figure 5:
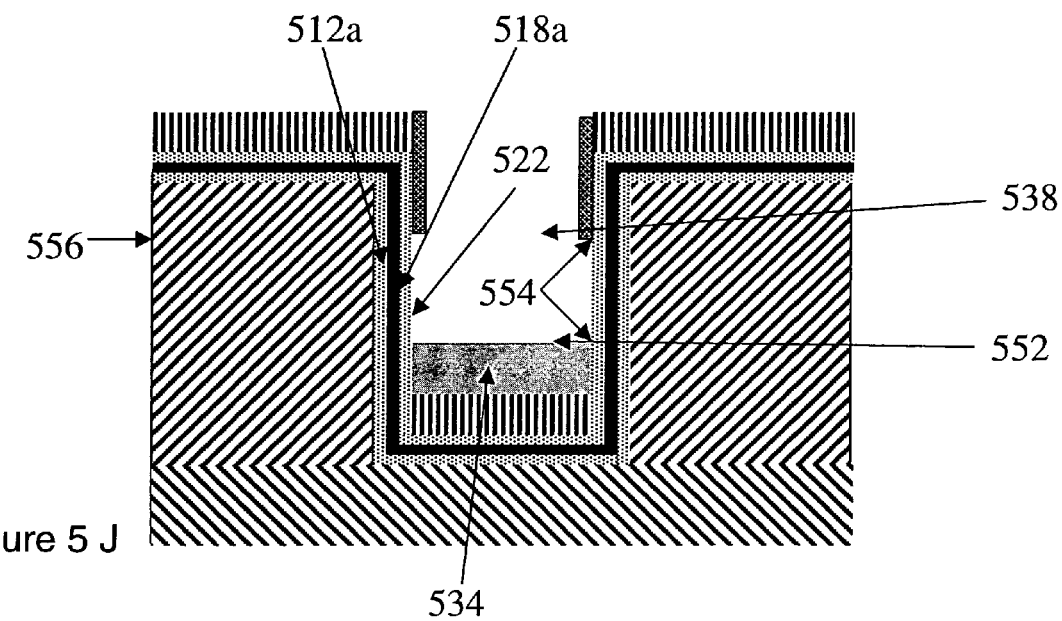
Figure 5:
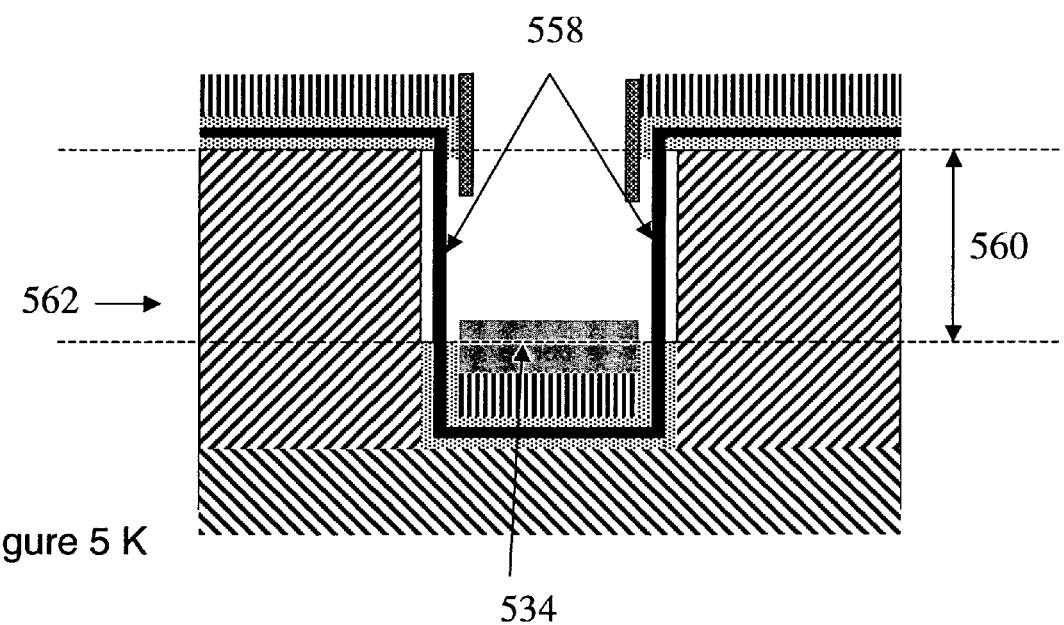
Figure 5:
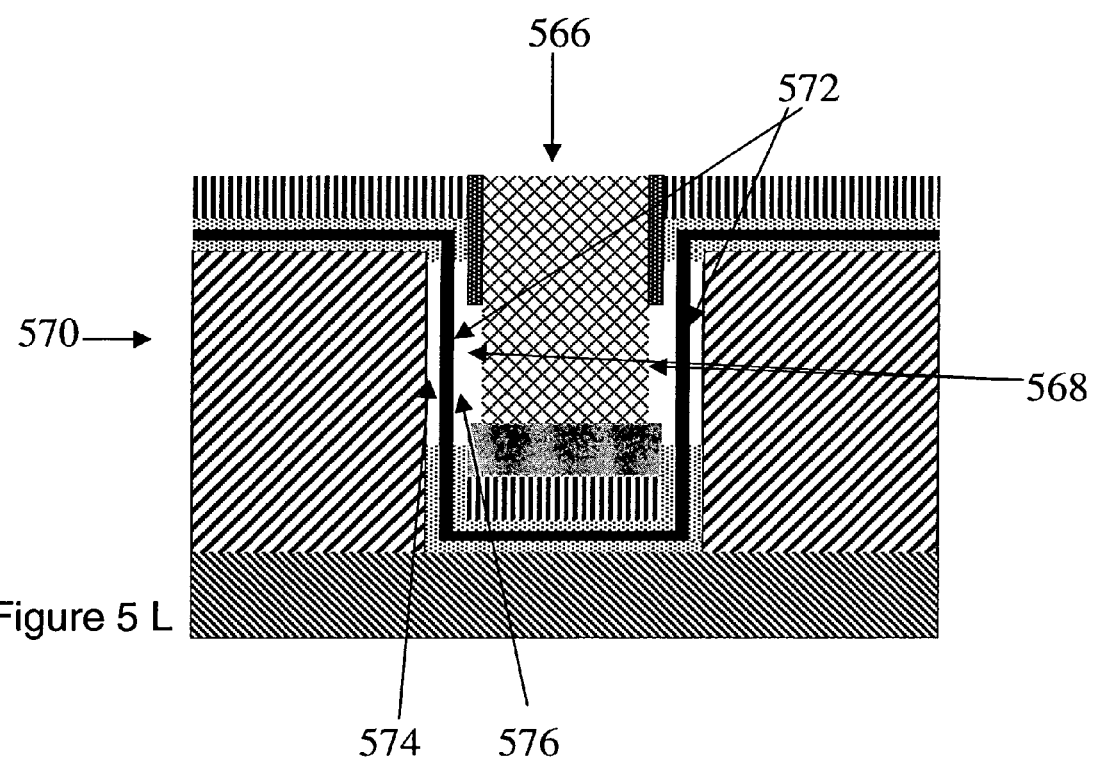

FIG. 5C illustrates a monolayer of nanofabric 518 applied to intermediate structure 516, forming intermediate structure 520. The nanofabric 518 may be applied by chemical vapor deposition, spin coating of suspensions of nanotubes, aerosolized nanotube suspensions or dipping into a solution of suspended nanotubes.

Nanofabric layer 518 conforms to the underlying insulating layer 512 and substantially follows the geometry of cavity 507. Examples of nanofabric articles and methods of manufacturing and using the same can be found in the previously-mentioned and incorporated references. The resulting structure 520 thus includes two vertical portions 518A of the nanofabric 518 which is perpendicular to the major surface of the substrate 501. Devices created using these vertical portions substantially parallel to channel 507 side walls 508, e.g. nano-switches, are termed "vertical" devices or switches.

FIG. 5D illustrates a second insulating layer 522 applied over nanofabric 518. Protective insulating layer 524 is deposited on top of second insulating layer 522 having top surface 526, forming intermediate structure 528. The protective insulating layer 524 is not deposited on the side walls of the channel. The thickness of protective insulating layer 524 can be, for example, on the order of 100 nm, and a non-exclusive example of the method of application of protective insulating layer 524, which may be an oxide layer, is by sputtering or high density plasma deposition of silicon dioxide. The optimal thickness is determined by the particular application to protect the layers below the insulating layer 524 from additional etching or deposition steps.

FIG. 5E illustrates a polysilicon layer 530 deposited on top surface 526 of intermediate structure 528, filling the space between walls 508 in cavity 507. Polysilicon layer 530 can be deposited to a height greater than that of top surface 526 in order to get the proper amount of polysilicon layer into cavity 507, creating an overfilling condition as in intermediate structure 532. Polysilicon layer 530 is subsequently planarized to etched polysilicon 534 with top surface 526 of oxide layer 524 as is illustrated by intermediate structure 536 (FIG. 5F).

FIG. 5G illustrates polysilicon layer 534 etched to a first depth 538, by any appropriate method. An exemplary method of creating such a depth is by reactive ion etch (RIE) as shown in intermediate structure 540; first depth 538 later helps define one edge of a suspended nanofabric segment. The thickness 541 of etched polysilicon layer 534 is dependent on original trench depth 509; for example the depth may be in a range from 200 nm to 1 micron and for applications requiring ultrahigh speed electromechanical switches, the depth would preferably be below 200 nm. This depth can be reduced using thin film manufacturing techniques, as mentioned elsewhere in this document and in the documents incorporated by reference.

FIG. 5H illustrates a layer of oxide 542 deposited on exposed surfaces of intermediate structure 540. Horizontal portions 544 of oxide layer cover trench walls and vertical oxide layers 546 cover exposed, top surfaces of polysilicon layer 534. Horizontal oxide layers 544 are removed, e.g., by oxide spacer etching, leaving intermediate structure 550 (FIG. 5I).

FIG. 5J illustrates polysilicon layer 534 etched to a second depth 552. Second depth 552 may be approximately 50 nm deeper than first depth 538. The defined gap 554 allows exposure of regions of second insulating layer 522 as is shown in intermediate structure 556.

Since preferred nanofabrics are permeable or porous, the regions 512A of first insulating layer 512 below the regions of nanotube fabric 518A are removable, e.g. by wet etching. Removal of materials from beneath a porous nanofabric has been described by the present applicants in the patent references incorporated above. Suitable wet etching conditions to remove the layers of first insulating layer 512 and second insulating layer 522 leave a suspended nanofabric 558 having vertical height 560 as observed in intermediate structure 562 (FIG. 5K). The wet etching may leave an overhang owing to the nature of isotropic wet etching conditions. Other techniques such as dry etching may be utilized to provide an anisotropic etching step.

The vertical height 560 is defined by the etching procedure. For a vertical height 560 of 200 nm the thicknesses of first insulating layer 512 and second insulating layer 522 would be approximately 20 nm in order to provide gap distances to create two non-volatile states. Smaller vertical gaps may be preferred in certain embodiments of the invention, e.g. 30 nm gap heights.

Electrode material 566 is deposited into trench 507, leaving gaps 568 between electrode material 566 and suspended nanotube fabric 558 as shown in intermediate structure 570 (FIG. 5L).

The structure 570 illustrates a pair of vertically-suspended nanofabric portions 572 surrounded by vertical gaps 574, 576 on either side of each portion. The structure may serve as a basis for a pair of bi- or tri-state switching devices as is explained below. The behavior of the switching devices is influenced by the strain in the suspended nanofabric portions and the surrounding gap distances, as discussed herein. Also, many configurations, including common electrode (e.g. 566) configurations may be obtained using the structure 570. It is possible to split structure 570 into two discrete sections (left, right) by a vertical divide running vertically through electrode 566 for example, leaving two bi- or tri-state switches that can be independently operated.

In these and other embodiments, the nature of the resulting devices and switches depends on the construction and arrangement of the electrodes and connections, among other factors. Attention is called to the construction of various types of electrodes in the following embodiments, as an indication of the flexibility of the design and concepts underlying these devices and the variety of their potential uses. For example, some devices share common electrodes between more than one nanofabric article (e.g. two nanofabric switch elements being influenced by a same shared electrode). Other devices have separate electrodes that control the behavior of the nanofabric. One or more electrodes can be used with each nanofabric article to control the article, as mentioned in the incorporated reference entitled "Electromechanical Three-Trace Junction Devices" (U.S. patent application Ser. No. 10/033,323), filed on Dec. 28, 2001.

If vertical height 560 is 200 nm and first insulating layer 512 and second insulating layer 522 are increased to a thickness of about 50 nm the nanotube switch of certain device types would become volatile at the necessary bias voltages because the deflected nanofabric has a strain energy higher than that of the van der Waals force keeping the fabric in contact with metallic region 504 or electrode 566. The thicknesses of first insulating layer 512 and second insulating layer 522 can be adjusted to generate either a non-volatile or volatile condition for a given vertical gap 560 as called for by particular applications with desired electrical characteristics.

Figure 6:
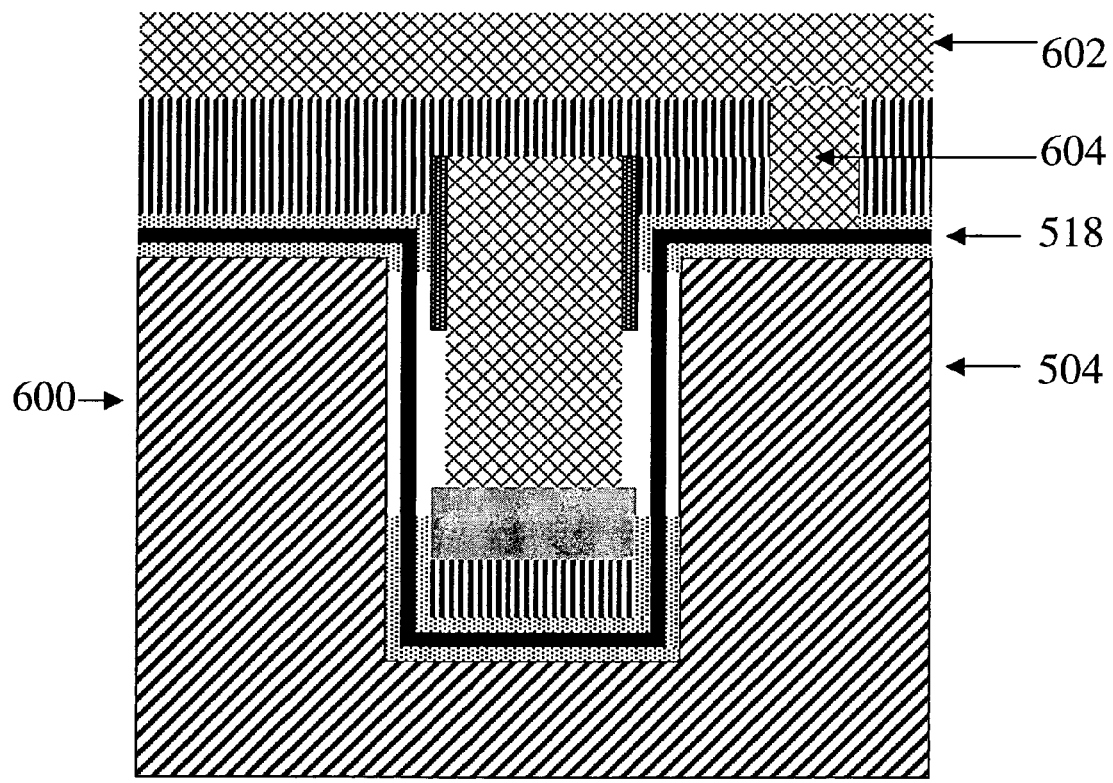
FIGS. 6–10 are cross-sectional views of various alternative embodiments of the invention.

Cross-sectional FIG. 6 illustrates an exemplary structure with subsequent layers of metallization. This structure includes electrode interconnect 602 and via 604 in contact with nanofabric 518, and a contiguous metallic layer 504 surrounding the electromechanical switch both laterally and subjacently, as shown in intermediate structure 600.

Figure 7:
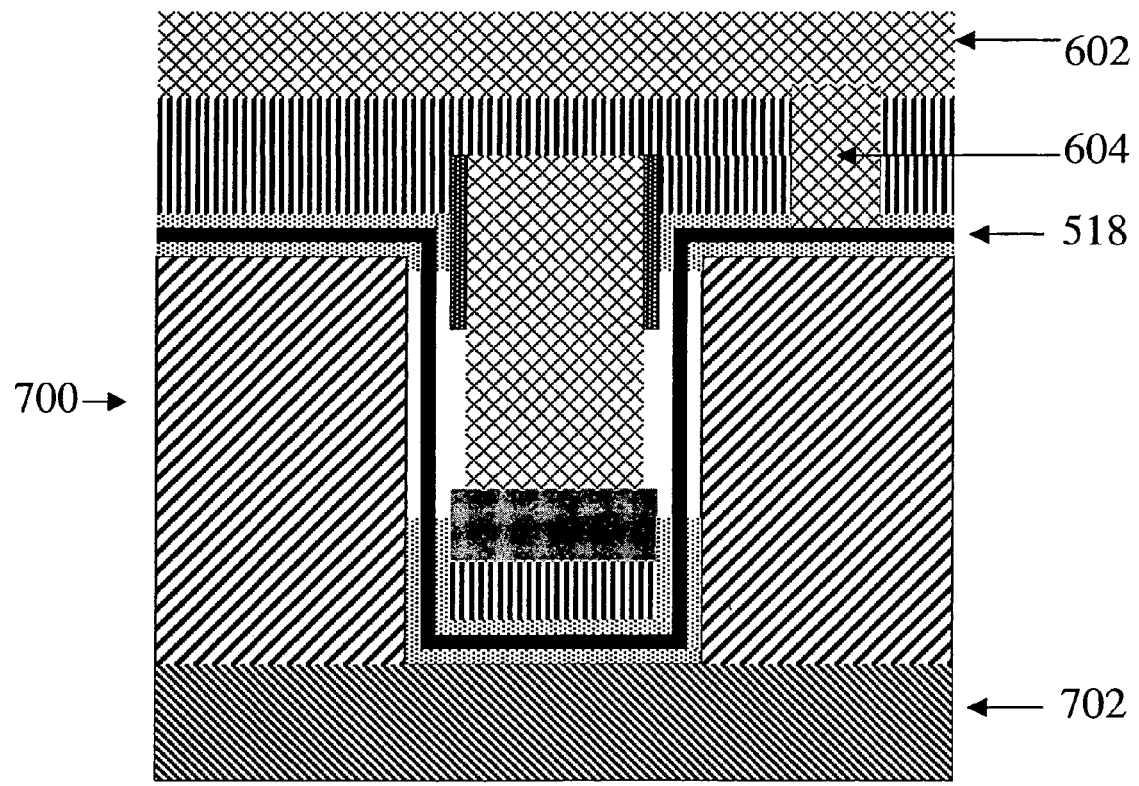

Cross-sectional FIG. 7 illustrates an exemplary structure with subsequent layers of metallization. This structure is similar to intermediate structure 600 in several respects. However, an insulating layer 702 separates the portions of metallic layers 504, and therefore metallic layer 504 does not surround the electromechanical switch elements, preventing crosstalk as shown in intermediate structure 600

Figure 8:
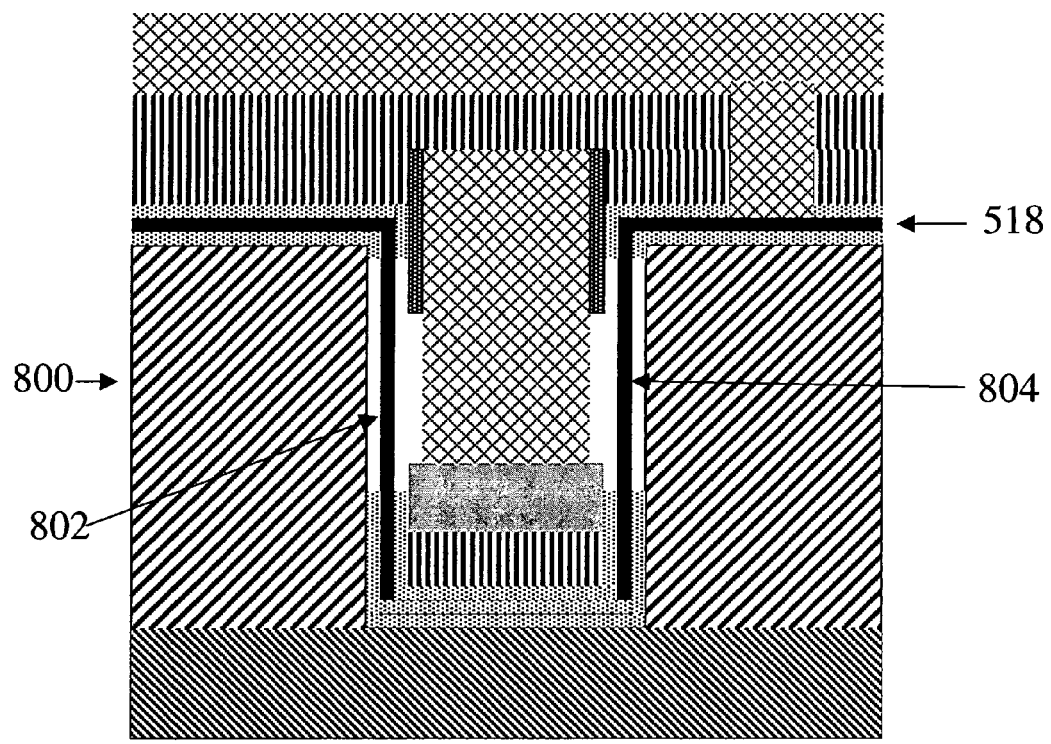

Cross-sectional FIG. 8 illustrates an exemplary structure with subsequent layers of metallization. This structure is similar to intermediate structure 700. However, the nanofabric layer 518 is not continuous, being split at the bottom and therefore there are two independent switches 802, 804, which have no crosstalk, as shown in intermediate structure 800.

Figure 9:
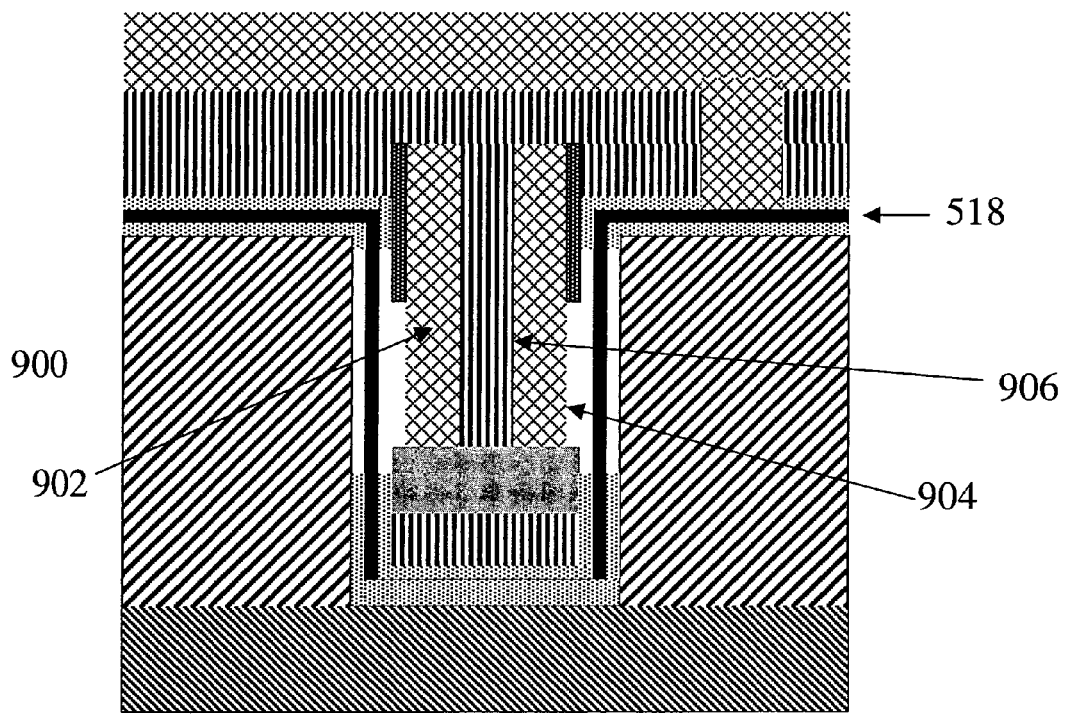

Cross-sectional FIG. 9 is an exemplary structure with subsequent layers of metallization. This structure is similar to intermediate structure 800; however, instead of a single central electrode, there are two central electrodes, 902, 904 separated by insulating layer 906. Thus, intermediate structure 900 has two nano-electromechanical switches, which can be operated independently.

Figure 10:
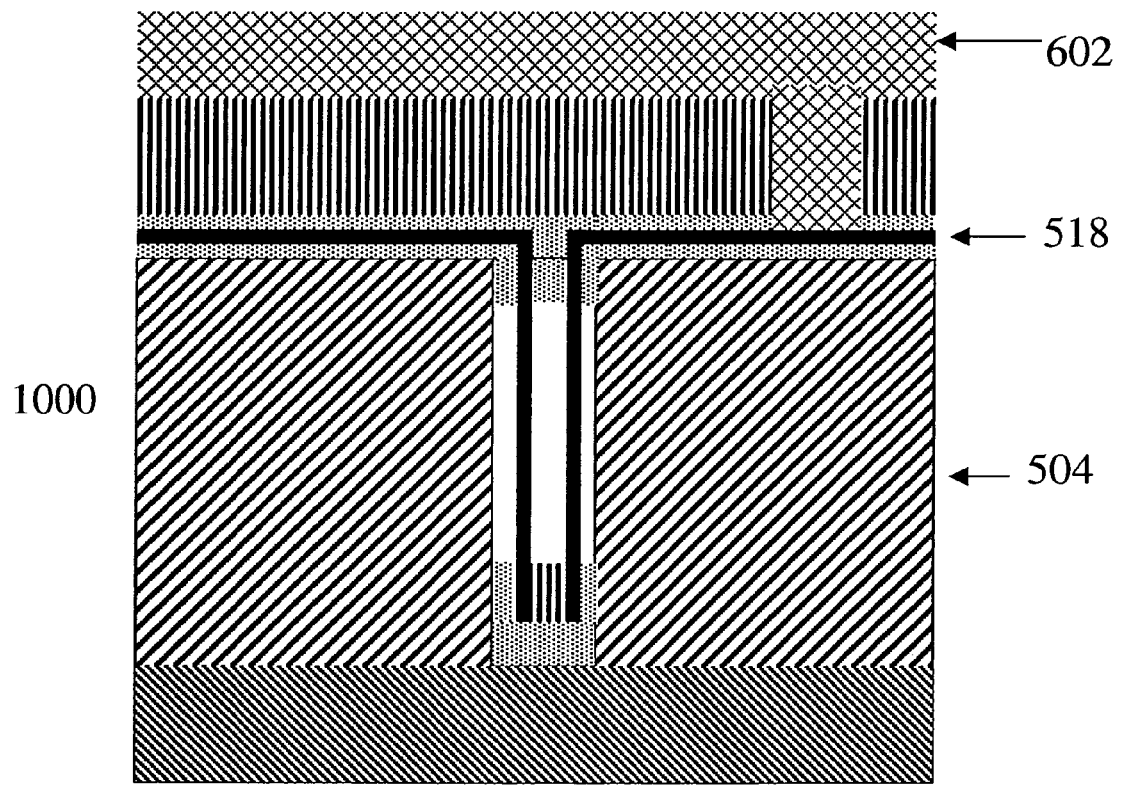

Cross-sectional FIG. 10 is an exemplary structure with subsequent layers of metallization. This structure is similar to intermediate structures 800 and 900, except there is no central electrode, at all. In this embodiment, it is possible for the nanofabric switches to contact metal layers 504 to make a volatile or non-volatile switch, and it is possible for the switches to contact one another so as to be volatile or non-volatile.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, rather than using metallic electrodes, some embodiments of the present invention may employ nanotubes. In fact, devices comprising nanotube and nanofabric articles in place of the electrodes shown above can be constructed as well.

In certain embodiments it may be advantageous to utilize such nanofabric electrodes as contacts to portions of a transistor or as part of a transistor or to contact or become part of an interconnect for subsequent sense amplifier or addressing logic circuitry, see e.g. U.S. Pat. Apl. No. 10/379,973 entitled, Hybrid Circuit Having Nanotube Electromechanical Memory.

Additional electrodes can provide extra control of a switch or device constructed according to the present description. For example, FIG. 6 includes two distinct electrodes that will push and/or pull the vertical nanofabric sections in unison. The gap distances will determine whether the devices are volatile or nonvolatile for a given set of parameters.

FIG. 7 includes 3 distinct electrodes and gives extra degrees of freedom (extra redundancy, extra information storage capability, etc.) to the devices. FIG. 8 also includes 3 electrodes.

FIG. 9 includes 4 distinct electrodes, since the center electrode is divided into two electrodes (902, 904) by application of divider 906.

FIG. 10 includes two electrodes on the sides of the channel, and uses a nanofabric section coupled to top electrode 602 as a third electrode in structure 1000.

As mentioned previously, using vertically-disposed nanofabric articles permits exploitation of the smaller dimensions achievable with thin film technology than with the lithographic techniques used in horizontally-disposed nanofabric articles. For example, returning to FIG. 1A, the dimension T, or thickness of the electrode 108, across which the nanofabric is suspended is as little as a few nm thick (e.g. 10–100 nm), and is formed using thin film techniques. As technology develops in this regard, the thickness T can be less than 10 nm thick. Therefore, the scaling of the dimensions tracks with thin film technology rather than scaling with lithographic technology. It should be noted that the gap distances used with reduced length nanofabric articles may also be decreased accordingly.

Figure 11A:
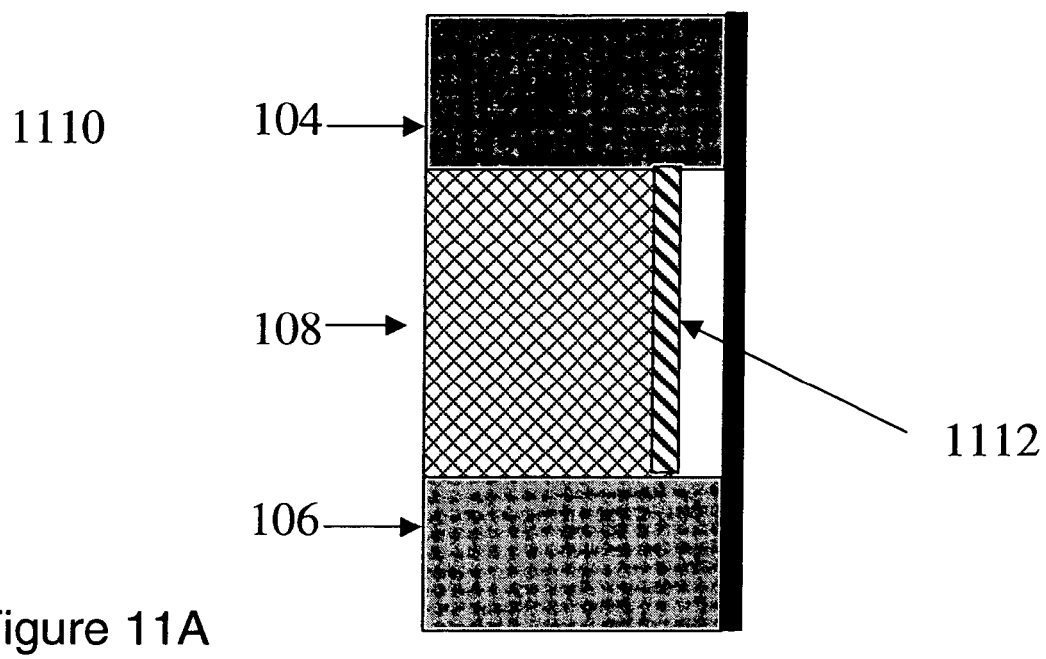
FIGS. 11A–B are cross-sectional views of an exemplary electromechanical devices.
Figure 11B:
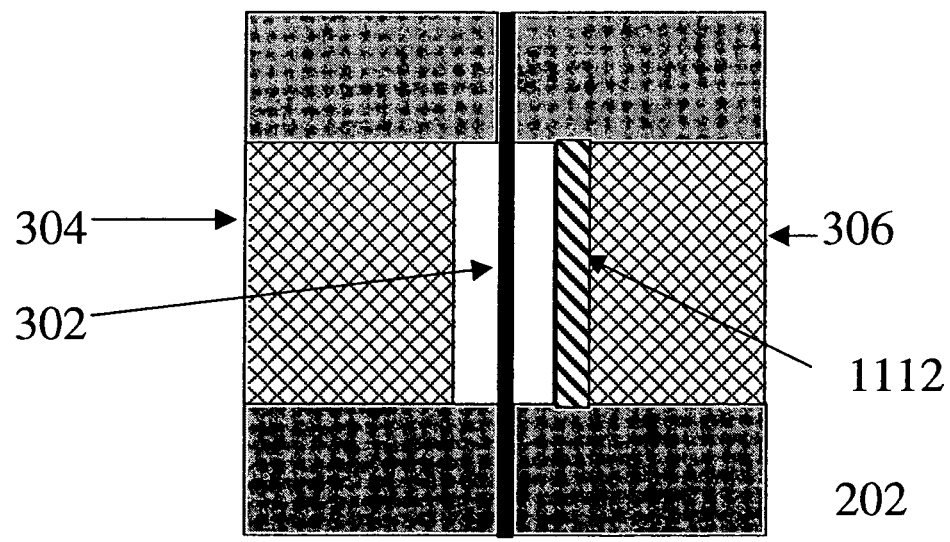

FIGS. 11A–B illustrate an embodiment of the present invention having an oxidized electrode. Structure 1110 illustrates a nanofabric based switch having an insulation layer 1112 over the exposed surface of one electrode 108. (Fabrication of such an oxidized electrode is explained in detail below. The insulation layer 1112 may be used to change the characteristics of the switch to be volatile or to provide further assurance of desired behavior. FIG. 11B illustrates a structure having opposing electrodes with a nanofabric switch disposed between them. The insulating layer, placed on the facing surface of an opposing electrode may be used to prevent different fibers from the nanofabric element from simultaneously electrically contacting both electrodes (304, 306) during a state transition. Such contact may prevent or hinder switching of the fabric between states.

Figure 12:
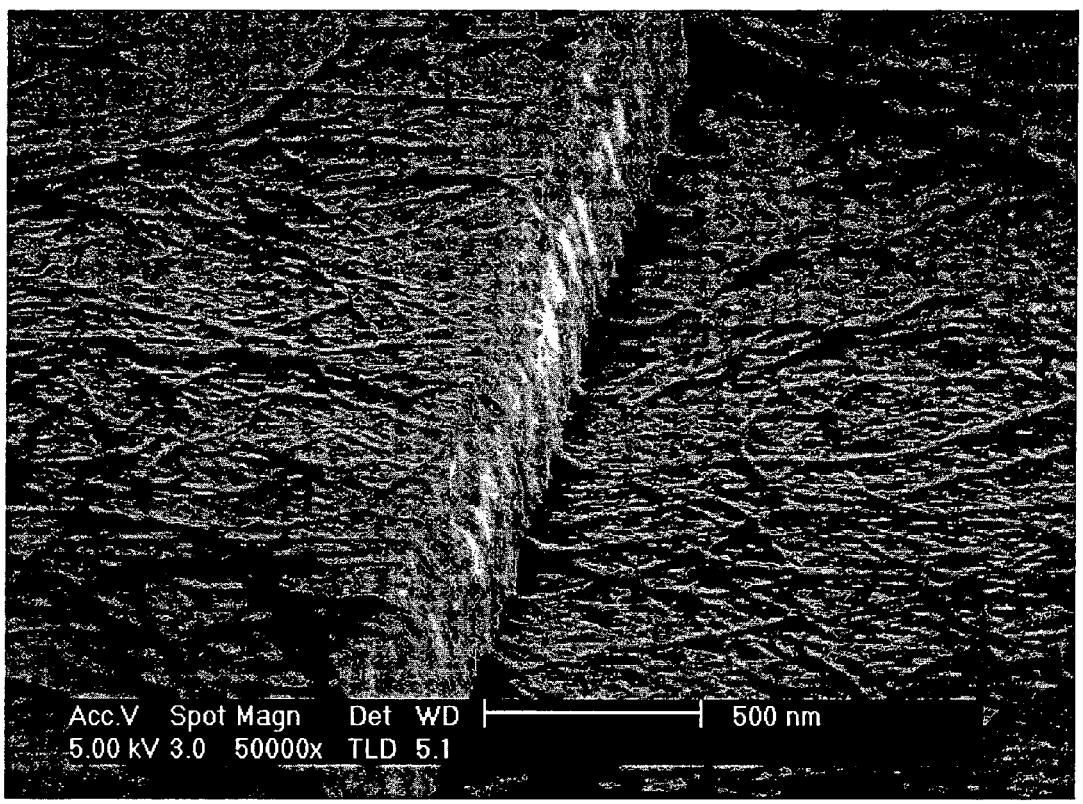
FIGS. 12 and 13 are micrographs of a nanofabric that conforms to non-planar surfaces.
Figure 13:
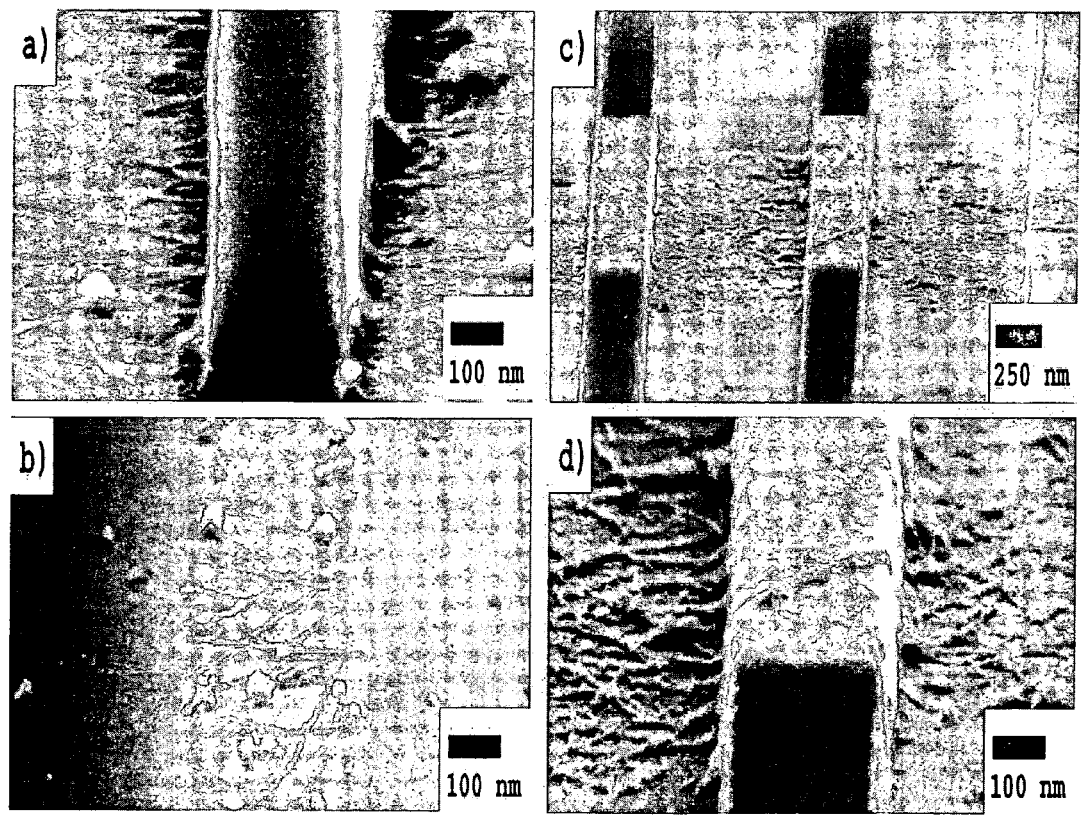

FIGS. 12 and 13 are micrographs of exemplary conformal nanofabrics. These figures illustrate how a fabric looks when formed and made to conform over vertical and horizontal surfaces.

The preferred embodiments are made using nanotube films, layers, or non-woven fabrics so that they form, or may be made to form, various useful patterned components, elements or articles. (Herein "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be employed to utilize the nanofabric articles and devices.

Preferred embodiments of the present invention include articles and methods that increase a strain in the nanofabrics, allowing selectable construction of volatile and non-volatile electromechanical switches, including tri-state or tri-trace switches having both volatile and non-volatile states. The nanofabrics in some embodiments also provide for discrete cellular articles, such as memory cells, to be manufactured.

Figure 14:
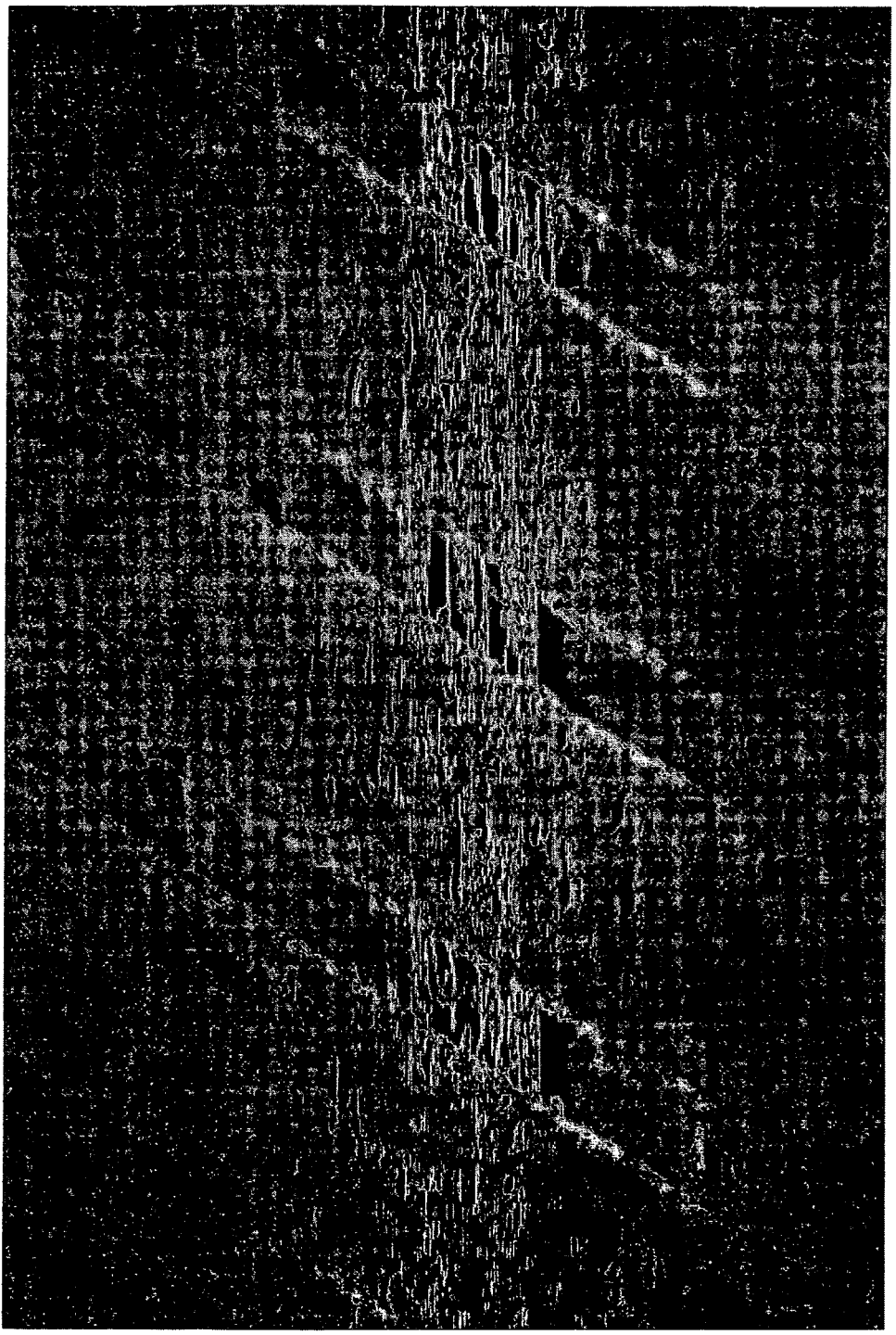
FIG. 14 is an image of an exemplary nanofabric shown in perspective.

FIG. 14 is an image of an exemplary fabric of nanotubes shown in perspective. As can be seen, the fabric may be highly porous and appear as several threads with gaps in between. In this figure there are actually several ribbons of nanofabric extending from left to right separated from one another by areas with no nanotubes. One may notice that the fabric of FIG. 13 is likewise very porous with a few nanotubes spanning the channel and contacting electrodes. In both figures, the resolution of the figure is affected by the imaging technology so some nanotubes may not appear in focus or be noticeable.

It will be further appreciated that the scope of the present invention is not limited to the above-described embodiments but rather is defined by the appended claims, and that these claims will encompass modifications and improvements to what has been described.

What is claimed is:

1. A method for making an electro-mechanical device, comprising:
   providing a structure having a channel with two vertical walls and a base and having a conductive trace having a face exposed to and parallel to one of the vertical walls;
   providing sacrificial material on the conductive trace;
   providing a nanotube article on the sacrificial layer and substantially conforming to at least a vertically-extending portion of the channel and sacrificial material; and
   removing at least a portion of the sacrificial material so that the nanotube article is vertically suspended and in spaced relation to the one conductive trace.

2. The method of claim 1 wherein the sacrificial material is deposited as a thin film and thus the vertically suspended portion of the nanotube article is defined by the thin film deposition.

3. The method of claim 1 wherein the nanotube article is formed by forming a fabric of nanotubes and then removing a portion of the fabric.

4. The method of claim 1 further comprising forming a conductive electrode in the channel before removal of the sacrificial material.

5. The method of claim 4 wherein the nanotube article is formed to have two vertical extents parallel to each wall of the channel and wherein the conductive electrode is disposed between the two vertical extents.

6. The method of claim 1 further comprising forming a conductive electrode in the channel before removal of the sacrificial material forming a second conductive trace in a second vertical wall of the channel, and wherein a second nanotube article is formed that is vertically suspended and in spaced relation to the one conductive trace and to the second vertical wall.

7. The method of claim 6 further comprising forming a second conductive electrode in the channel.

8. The method of claim 1 further comprising forming a second conductive trace in a second vertical wall of the channel and forming a second nanotube article vertically suspended and in spaced relation to the second conductive trace and to the second vertical wall.

* * * * *